(12) United States Patent
Zhamu et al.

(10) Patent No.: US 10,161,056 B2
(45) Date of Patent: Dec. 25, 2018

(54) HEAT DISSIPATION SYSTEM COMPRISING A UNITARY GRAPHENE MONOLITH

(71) Applicant: Nanotek Instruments, Inc., Dayton, OH (US)

(72) Inventors: Aruna Zhamu, Springboro, OH (US); Wei Xiong, Dayton, OH (US); Bor Z. Jang, Centerville, OH (US)

(73) Assignee: Nanotek Instruments, Inc., Dayton, OH (US)

( * ) Notice: Subject to any disclaimer, the term of this patent is extended or adjusted under 35 U.S.C. 154(b) by 0 days.

(21) Appl. No.: 15/852,861

(22) Filed: Dec. 22, 2017

(65) Prior Publication Data

US 2018/0135200 A1 May 17, 2018

Related U.S. Application Data

(60) Continuation of application No. 15/354,706, filed on Nov. 17, 2016, now Pat. No. 9,890,469, which is a (Continued)

(51) Int. Cl.
*C30B 1/02* (2006.01)
*C01B 32/182* (2017.01)
(Continued)

(52) U.S. Cl.
CPC .............. *C30B 1/02* (2013.01); *C01B 32/182* (2017.08); *C01B 32/184* (2017.08); *C01B 32/19* (2017.08);
(Continued)

(58) Field of Classification Search
CPC ...... C01B 32/182; C01B 32/184; C01B 32/22; C01B 32/23; C01B 32/225; C01B 32/192;
(Continued)

(56) References Cited

U.S. PATENT DOCUMENTS 2,798,878 A 7/1957 Hummers
4,666,736 A 5/1987 Matsumura et al.
(Continued)

FOREIGN PATENT DOCUMENTS

WO 2012006657 A1 1/2012

OTHER PUBLICATIONS

U.S. Appl. No. 13/815,246 final Office Action dated Dec. 28, 2016, 9 pages.
(Continued)

*Primary Examiner* — Daniel McCracken

(57) ABSTRACT

A unitary graphene layer or graphene single crystal containing closely packed and chemically bonded parallel graphene planes having an inter-graphene plane spacing of 0.335 to 0.40 nm and an oxygen content of 0.01% to 10% by weight, which unitary graphene layer or graphene single crystal is obtained from heat-treating a graphene oxide gel at a temperature higher than 100° C., wherein the average misorientation angle between two graphene planes is less than 10 degrees, more typically less than 5 degrees. The molecules in the graphene oxide gel, upon drying and heat-treating, are chemically interconnected and integrated into a unitary graphene entity containing no discrete graphite flake or graphene platelet. This graphene monolith exhibits a combination of exceptional thermal conductivity, electrical conductivity, mechanical strength, surface smoothness, surface hardness, and scratch resistance unmatched by any thin-film material of comparable thickness range.

20 Claims, 18 Drawing Sheets

Related U.S. Application Data division of application No. 13/694,356, filed on Nov. 26, 2012, now Pat. No. 9,533,889.

(51) Int. Cl.

| | | |
|---|---|---|
| *C01B 32/19* | (2017.01) | |
| *C01B 32/192* | (2017.01) | |
| *C01B 32/22* | (2017.01) | |
| *C01B 32/225* | (2017.01) | |
| *C01B 32/23* | (2017.01) | |
| *C30B 5/00* | (2006.01) | |
| *C30B 29/02* | (2006.01) | |
| *C30B 29/68* | (2006.01) | |
| *C01B 32/184* | (2017.01) | |
| *B82Y 30/00* | (2011.01) | |
| *B82Y 40/00* | (2011.01) | |

(52) U.S. Cl.
CPC ............ *C01B 32/192* (2017.08); *C01B 32/22* (2017.08); *C01B 32/225* (2017.08); *C01B 32/23* (2017.08); *C30B 5/00* (2013.01); *C30B 29/02* (2013.01); *C30B 29/68* (2013.01); *B82Y 30/00* (2013.01); *B82Y 40/00* (2013.01); *C01P 2006/10* (2013.01); *C01P 2006/32* (2013.01); *C01P 2006/40* (2013.01); *C01P 2006/80* (2013.01); *Y10S 977/734* (2013.01); *Y10S 977/842* (2013.01); *Y10T 428/30* (2015.01)

(58) Field of Classification Search
CPC ....... C01B 32/19; Y10T 428/30; B82Y 30/00; B82Y 40/00; C01P 2006/10; C01P 2006/32; C01P 2006/40; C30B 1/02; C30B 5/00; C30B 29/02; C30B 29/68
See application file for complete search history.

(56) References Cited

U.S. PATENT DOCUMENTS

| | | | |
|---|---|---|---|
| 5,831,374 | A | 11/1998 | Morita et al. |
| 6,771,502 | B2 | 8/2004 | Getz et al. |
| 7,071,258 | B1 | 7/2006 | Jang et al. |
| 7,150,914 | B2 | 12/2006 | Clovesko et al. |
| 7,160,619 | B2 | 1/2007 | Clovesko et al. |
| 7,166,237 | B2 | 1/2007 | Klett et al. |
| 7,306,847 | B2 | 12/2007 | Capp et al. |
| 7,385,819 | B1 | 6/2008 | Shives et al. |
| 7,566,410 | B2 | 7/2009 | Song et al. |
| 7,662,321 | B2 | 2/2010 | Guo et al. |
| 8,173,095 | B2 | 5/2012 | Heer et al. |
| 8,574,720 | B2 | 11/2013 | Carney et al. |
| 8,778,538 | B2 | 7/2014 | Kung et al. |
| 9,360,905 | B2 | 6/2016 | Zhamu et al. |
| 9,363,932 | B2 | 6/2016 | Wang et al. |
| 9,533,889 | B2 | 1/2017 | Zhamu et al. |
| 2005/0271574 | A1 | 12/2005 | Jang et al. |
| 2006/0035085 | A1 | 2/2006 | Ozaki et al. |
| 2006/0056157 | A1 | 3/2006 | Ford et al. |
| 2008/0048152 | A1 | 2/2008 | Jang et al. |
| 2008/0248275 | A1 | 10/2008 | Jang et al. |
| 2009/0087493 | A1 | 4/2009 | Dai et al. |
| 2009/0155561 | A1 | 6/2009 | Choi et al. |
| 2009/0325071 | A1 | 12/2009 | Verbrugge et al. |
| 2010/0000441 | A1 | 1/2010 | Jang et al. |
| 2010/0055025 | A1 | 3/2010 | Jang et al. |
| 2010/0055464 | A1 | 3/2010 | Sung |
| 2010/0085713 | A1 | 4/2010 | Balandin et al. |
| 2010/0128439 | A1 | 5/2010 | Tilak et al. |
| 2010/0140792 | A1 | 6/2010 | Haddon et al. |
| 2010/0143798 | A1 | 6/2010 | Zhamu et al. |
| 2010/0222482 | A1 | 9/2010 | Jang et al. |
| 2010/0255984 | A1 | 10/2010 | Sutter et al. |
| 2010/0301279 | A1 | 12/2010 | Nesper et al. |
| 2011/0059599 | A1 | 3/2011 | Ward et al. |
| 2011/0108978 | A1 | 5/2011 | Kim et al. |
| 2011/0159372 | A1 | 6/2011 | Zhamu et al. |
| 2011/0183180 | A1 | 7/2011 | Yu et al. |
| 2011/0186789 | A1 | 8/2011 | Samulski et al. |
| 2011/0189452 | A1 | 8/2011 | Lettow et al. |
| 2011/0227000 | A1 | 9/2011 | Ruoff et al. |
| 2011/0247795 | A1 | 10/2011 | Horng |
| 2011/0274610 | A1 | 11/2011 | Paquette et al. |
| 2011/0280787 | A1 | 11/2011 | Chen et al. |
| 2011/0318257 | A1 | 12/2011 | Sokolov et al. |
| 2012/0021224 | A1 | 1/2012 | Everett et al. |
| 2012/0034442 | A1 | 2/2012 | Pauzauskie et al. |
| 2012/0190139 | A1 | 7/2012 | Na et al. |
| 2012/0196074 | A1 | 8/2012 | Ago et al. |
| 2012/0205606 | A1 | 8/2012 | Lee et al. |
| 2012/0208008 | A1 | 8/2012 | Tour et al. |
| 2012/0211159 | A1 | 8/2012 | Hougham et al. |
| 2012/0234524 | A1 | 9/2012 | Fan et al. |
| 2012/0270960 | A1 | 10/2012 | Felisari et al. |
| 2012/0272868 | A1 | 11/2012 | Berry et al. |
| 2012/0308741 | A1 | 12/2012 | Kim et al. |
| 2012/0314365 | A1 | 12/2012 | Matsumoto et al. |
| 2013/0001068 | A1 | 1/2013 | Zhamu et al. |
| 2013/0005917 | A1 | 1/2013 | Zhamu et al. |
| 2013/0092229 | A1 | 4/2013 | Kue et al. |
| 2013/0130037 | A1 | 5/2013 | Bol et al. |
| 2013/0136684 | A1 | 5/2013 | Wu et al. |
| 2013/0181166 | A1 | 7/2013 | Tetsuka |
| 2013/0190449 | A1 | 7/2013 | Kinloch et al. |
| 2013/0200300 | A1 | 8/2013 | Hoe et al. |
| 2013/0213630 | A1 | 8/2013 | John |
| 2013/0230722 | A1 | 9/2013 | Fujii et al. |
| 2013/0236715 | A1 | 9/2013 | Zhamu et al. |
| 2013/0264041 | A1 | 10/2013 | Zhamu et al. |
| 2013/0272951 | A1 | 10/2013 | Hiura et al. |
| 2013/0329366 | A1 | 12/2013 | Wang et al. |

OTHER PUBLICATIONS

U.S. Appl. No. 13/815,246 final Office Action dated Jun. 16, 2017, 6 pages.
U.S. Appl. No. 13/815,246 nonfinal Office Action dated Apr. 28, 2016, 12 pages.
U.S. Appl. No. 13/815,246 nonfinal Office Action dated Nov. 22, 2017, 6 pages.
U.S. Appl. No. 13/815,246 Response final Office Action dated Apr. 19, 2017, 12 pages.
U.S. Appl. No. 13/815,246 Response final Office Action dated Aug. 3, 2015, 2 pages.
U.S. Appl. No. 13/815,246 Response final Office Action dated Sep. 13, 2017, 12 pages.
U.S. Appl. No. 13/815,246 Response final Office Action dated Sep. 25, 2017, 16 pages.
U.S. Appl. No. 13/815,246 Response nonfinal Office Action dated Oct. 13, 2016, 12 pages.
U.S. Appl. No. 13/815,246 Response nonfinal Office Action dated Oct. 30, 2017, 4 pages.
U.S. Appl. No. 13/694,161 Response to fOA dated Nov. 2, 2016, 37 pages.
U.S. Appl. No. 13/694,161 Response to nfOA dated Aug. 15, 2017, 12 pages.
U.S. Appl. No. 13/694,161 Response to nfOA dated Mar. 18, 2016, 20 pages.
U.S. Appl. No. 13/694,162 Advisory Action dated Dec. 15, 2015, 3 pages.
U.S. Appl. No. 13/694,162 Final Office Action dated Aug. 26, 2015, 18 pages.
U.S. Appl. No. 13/694,162 Final Office Action dated Feb. 7, 2017, 13 pages.
U.S. Appl. No. 13/694,162 Nonfinal Office Action dated Feb. 11, 2015, 14 pages.
U.S. Appl. No. 13/694,162 Nonfinal Office Action dated Jun 29, 2016, 13 pages.

(56) References Cited

OTHER PUBLICATIONS

U.S. Appl. No. 13/694,162 Response to Final Office Action dated Jun. 26, 2017, 14 pages.
U.S. Appl. No. 13/694,162 Response to Final Office Action dated Nov. 24, 2015, 29 pages.
U.S. Appl. No. 13/694,162 Response to Nonfinal Office Action dated May 8, 2015, 23 pages.
U.S. Appl. No. 13/694,162 Response to Nonfinal Office Action dated Oct. 27, 2016, 15 pages.
U.S. Appl. No. 13/694,356 Final OA dated Apr. 30, 2015, 11 pages.
U.S. Appl. No. 13/694,356 Final OA dated Jan. 10, 2014, 11 pages.
U.S. Appl. No. 13/694,356 Final OA dated Jun. 13, 2016, 4 pages.
U.S. Appl. No. 13/694,356 Nonfinal OA dated Aug. 12, 2013, 9 pages.
U.S. Appl. No. 13/694,356 Nonfinal OA dated Jul. 26, 2016, 10 pages.
U.S. Appl. No. 13/694,356 Nonfinal OA dated Sep. 25, 2015, 13 pages.
U.S. Appl. No. 13/694,356 Nonfinal OA dated Sep. 30, 2014, 12 pages.
U.S. Appl. No. 13/694,356 Resp Adv Act dated May 5, 2014, 28 pages.
U.S. Appl. No. 13/694,356 Resp Final OA dated Apr. 7, 2014, 27 pages.
U.S. Appl. No. 13/694,356 Resp Final OA dated Jul. 30, 2015, 24 pages.
U.S. Appl. No. 13/694,356 Resp Final OA dated Jun. 14, 2016, 7 pages.
U.S. Appl. No. 13/694,356 Resp Nonfinal OA dated Dec. 22, 2014, 31 pages.
U.S. Appl. No. 13/694,356 Resp Nonfinal OA dated Feb. 5, 2016, 16 pages.
U.S. Appl. No. 13/694,356 Resp Nonfinal OA dated Oct. 18, 2013, 18 pages.
U.S. Appl. No. 13/694,356 Resp Nonfinal OA dated Sep. 12, 2016, 7 pages.
U.S. Appl. No. 13/694,356 Advisory Action dated Apr. 28, 2014, 4 pages.
U.S. Appl. No. 13/694,468 Resp nfOA dated May 13, 2015, 17 pages.
U.S. Appl. No. 13/694,468 fOA dated Jul. 13, 2015, 8 pages.
U.S. Appl. No. 13/694,468 nfOA dated Feb. 23, 2015, 13 pages.
U.S. Appl. No. 13/694,468 Resp fOA dated Jul. 29, 2015, 14 pages.
U.S. Appl. No. 13/694,722 Final Office Action dated dated Jun. 2, 2017, 14 pages.
U.S. Appl. No. 13/694,722, Final Office Action dated Nov. 17, 2015, 12 pages.
U.S. Appl. No. 13/694,722 Nonfinal Office Action dated Apr. 22, 2015, 9 pages.
U.S. Appl. No. 13/694,722 Nonfinal Office Action dated Oct. 7, 2016, 9 pages.
U.S. Appl. No. 13/694,722 Response to Final Office Action dated Feb. 17, 2016, 12 pages.
U.S. Appl. No. 13/694,722 Response to Final Office Action dated Sep. 22, 2017, 12 pages.
U.S. Appl. No. 13/694,722 Response to Nonfinal Office Action dated Feb. 1, 2017, 13 pages.
U.S. Appl. No. 13/694,722 Response to Nonfinal Office Action dated Jul. 27, 2015, 10 pages.
U.S. Appl. No. 13/694,791 Final Office Action dated Jun. 3, 2016, 17 pages.
U.S. Appl. No. 13/694,791 Nonfinal Office Action dated Nov. 9, 2015, 15 pages.
U.S. Appl. No. 13/694,791 Response Final Office Action dated Oct. 26, 2016, 21 pages.
U.S. Appl. No. 13/694,791 Response Nonfinal Office Action dated Feb. 16, 2016, 19 pages.
U.S. Appl. No. 13/815,100 final Office Action dated Nov. 3, 2016, 34 pages.
U.S. Appl. No. 13/815,100 nonfinal Office Action dated Mar. 13, 2017, 25 pages.
U.S. Appl. No. 13/815,100 Nonfinal Office Action dated Mar. 24, 2016, 29 pages.
U.S. Appl. No. 13/815,100 Response final Office Action dated Feb. 1, 2017, 28 pages.
U.S. Appl. No. 13/815,100 Response nonfinal Office Action dated Jul. 18, 2016, 16 pages.
U.S. Appl. No. 13/815,100 Response nonfinal Office Action dated Jun. 29, 2017, 14 pages.
Batzill, "The Surface Science of Graphene: Metal Interfaces, CVD Synthesis, Nanonbbons, Chemical Modifications, and Defects" Surf. Sci. Rep. (2012) vol. 67, pp. 83-115.
Dreyer et al., "The chemistry of graphene oxide" Chem. Soc. Rev. (2010) vol. 39, pp. 228-240.
Gong et al., "Graphitization of Graphene Oxide with Ethanol during Thermal Reduction" J. Chem. Phys. C (2012) vol. 116, pp. 9969-9979.
Kidambi et al., "The Parameter Space of Graphene Chemical Vapor Deposition on Polycrystalline Cu" The Journal of Physical Chemistry (2012) vol. 116, No. 42, pp. 22492-22501.
Li et al., "Evolution of Graphene Growth on Ni and Cu by Carbon Isotope Labeling" Nano Letters (2009) vol. 9, pp. 4268-4272.
Reina et al., "Large Area, Few-Layer Graphene Films on Arbitrary Substrates by Chemical Vapor Deposition" Nano Letters (2009) vol. 9, pp. 30-35.
Tsen et al., "Tailoring Electrical Transport Across Grain Boundaries in Polycrystalline Graphene" Science (2012) vol. 336, pp. 1143-1146.
U.S. Appl. No. 13/385,813 Advisory Action dated Sep. 9, 2016, 8 pages.
U.S. Appl. No. 13/385,813 Final Office Action dated Apr. 22, 2016, 18 pages.
U.S. Appl. No. 13/385,813 Nonfinal Office Action dated Oct. 21, 2015, 14 pages.
U.S. Appl. No. 13/385,813 Response to Final Office dated Apr. 22, 2016, 31 pages.
U.S. Appl. No. 13/385,813 Response to Nonfinal Office Action, 37 pages.
U.S. Appl. No. 13/506,265 Final Office Action dated Nov. 28, 2014, 10 pages.
U.S. Appl. No. 13/506,265 Nonfinal Office Action dated Aug. 14, 2014, 9 pages.
U.S. Appl. No. 13/506,265 Nonfinal Office Action dated Aug. 25, 2015, 8 pages.
U.S. Appl. No. 13/506,265 Nonfinal Office Action dated Mar. 17, 2015, 10 pages.
U.S. Appl. No. 13/506,265 Response to Final Office Action filed Feb. 19, 2015, 23 pages.
U.S. Appl. No. 13/506,265 Response to Nonfinal Office Action dated Dec. 10, 2015, 7 pages.
U.S. Appl. No. 13/506,265 Response to Nonfinal Office Action dated Jun. 22, 2015, 18 pages.
U.S. Appl. No. 13/506,265 Response to Nonfinal Office Action dated Oct. 14, 2014, 16 pages.
U.S. Appl. No. 13/507,167 Final Office Action dated Jan. 21, 2016, 30 pages.
U.S. Appl. No. 13/507,167 Nonfinal Office Action dated Aug. 25, 2015, 14 pages
U.S. Appl. No. 13/507,167 Response to Final Office Action dated Mar. 21, 2016, 30 pages.
U.S. Appl. No. 13/507,167 Response to Nonfinal Office Action dated Nov. 23, 2015, 34 pages.
U.S. Appl. No. 13/694,161 Advisory Action dated Dec. 9, 2016, 6 pages.
U.S. Appl. No. 13/694,161 fOA dated Jun. 17, 2016, 37 pages.
U.S. Appl. No. 13/694,161 nfOA dated Dec. 9, 2015, 33 pages.
U.S. Appl. No. 13/694,161 nfOA dated May 17, 2017, 28 pages.

20 μm (Scale bar = 5 µm per interval)

Poly-crystalline graphene from catalytic CVD

Single-grain (single crystal) graphene

Graphene poly-crystal with incomplete grain boundaries (essentially a graphene single crystal with defects)

HEAT DISSIPATION SYSTEM COMPRISING A UNITARY GRAPHENE MONOLITH

CROSS-REFERENCE TO RELATED APPLICATION

This application is a continuation of U.S. application Ser. No. 15/354,706, filed on Nov. 17, 2016, which is a divisional of U.S. application Ser. No. 13/694,356, filed on Nov. 26, 2012, the contents of which is incorporated herein, in its entirety, for all purposes.

FIELD OF THE INVENTION

The present invention relates generally to the field of graphitic materials for heat dissipation applications, and more particularly to a graphene oxide-derived graphene monolith or graphene single crystal that exhibits a combination of an exceptionally high thermal conductivity, high electrical conductivity, high mechanical strength, good surface scratch resistance, and good hardness.

BACKGROUND OF THE INVENTION

Carbon is known to have five unique crystalline structures, including diamond, fullerene (0-D nano graphitic material), carbon nanotube (1-D nano graphitic material), graphene (2-D nano graphitic material), and graphite (3-D graphitic material).

The carbon nanotube (CNT) refers to a tubular structure grown with a single wall or multi-wall. Carbon nanotubes have a diameter on the order of a few nanometers to a few hundred nanometers. Its longitudinal, hollow structure imparts unique mechanical, electrical and chemical properties to the material. CNT is a 1-D (one-dimensional) nano carbon or 1-D nano graphite material.

Bulk natural flake graphite is a 3-D graphitic material with each particle being composed of multiple grains (or graphite single crystals or crystallites) with grain boundaries (amorphous or defect zones) demarcating neighboring graphite single crystals. Each grain is composed of multiple graphene planes oriented parallel to one another. A graphene plane in a graphite crystallite is composed of carbon atoms occupying a two-dimensional, hexagonal lattice. In a given grain or single crystal, the graphene planes are stacked and bonded via van der Waal forces in the crystallographic c-direction (perpendicular to the graphene plane or basal plane). Although all the graphene planes in one grain are parallel to one another, typically the graphene planes in one grain and the graphene planes in an adjacent grain are different in orientation. In other words, the orientations of the various grains in a graphite particle typically differ from one grain to another.

A graphite single crystal (crystallite) is anisotropic with a property measured along a direction in the basal plane (crystallographic a or b direction) being dramatically different than if measured along the crystallographic c-direction (thickness direction). For instance, the thermal conductivity of a graphite single crystal can be up to approximately 1,920 W/mK (theoretical) or 1,800 W/mK (experimental) in the basal plane (crystallographic a- and b-axis directions), but that along the crystallographic c-axis direction is less than 10 W/mK (typically less than 5 W/mK). Consequently, a natural graphite particle composed of multiple grains of different orientations has a property lying between these two extremes. It would be highly desirable in many applications to produce a bulk graphite particle (containing single or multiple grains) having sufficiently large dimensions and having all graphene planes being essentially parallel to one another along one desired direction. For instance, it is highly desirable to have one bulk graphite particle (e.g. a unitary layer entity of multiple graphene planes) with all the graphene planes being substantially parallel to one another) and this unitary layer entity has a sufficiently large length/width for a particular application (e.g. >5 cm$^2$ for use as a heat-spreading sheet on a CPU of a smart phone). It has not been possible to produce this type of large unitary graphene entity from existing natural or synthetic graphite particles.

The constituent graphene planes of a graphite crystallite can be extracted or isolated from a graphite crystallite to form individual graphene sheets of carbon atoms. An isolated, individual graphene sheet is commonly referred to as single-layer graphene. A stack of multiple graphene planes bonded through van der Waals forces in the thickness direction is commonly referred to as a multi-layer graphene, typically having up to 300 layers or graphene planes (<100 nm in thickness), but more typically up to 30 graphene planes (<10 nm in thickness), even more typically up to 20 graphene planes (<7 nm in thickness), and most typically up to 10 graphene planes (commonly referred to as few-layer graphene in scientific community). Single-layer graphene and multi-layer graphene sheets are collectively called "nano graphene platelets" (NGPs). Graphene or NGP is a new class of carbon nano material (a 2-D nano carbon) that is distinct from the 0-D fullerene, the 1-D CNT, and the 3-D graphite.

Our research group pioneered the development of graphene materials and related production processes as early as 2002: (1) B. Z. Jang and W. C. Huang, "Nano-scaled Graphene Plates," U.S. Pat. No. 7,071,258 (Jul. 4, 2006), application submitted in October 2012; (2) B. Z. Jang, et al. "Process for Producing Nano-scaled Graphene Plates," U.S. patent application Ser. No. 10/858,814 (Jun. 3, 2004); and (3) B. Z. Jang, A. Zhamu, and J. Guo, "Process for Producing Nano-scaled Platelets and Nanocomposites," U.S. patent application Ser. No. 11/509,424 (Aug. 25, 2006).

NGPs are typically obtained by intercalating natural graphite particles with a strong acid and/or oxidizing agent to obtain a graphite intercalation compound (GIC) or graphite oxide (GO), as illustrated in FIG. 1(a) (process flow chart) and FIG. 1(b) (schematic drawing). This is most often accomplished by immersing natural graphite powder (20 in FIGS. 1(a) and 100 in FIG. 1(b)) in a mixture of sulfuric acid, nitric acid (an oxidizing agent), and another oxidizing agent (e.g. potassium permanganate or sodium chlorate). The resulting GIC (22 or 102) is actually some type of graphite oxide (GO) particles. This GIC is then repeatedly washed and rinsed in water to remove excess acids, resulting in a graphite oxide suspension or dispersion, which contains discrete and visually discernible graphite oxide particles dispersed in water. There are two processing routes to follow after this rinsing step:

Route 1 involves removing water from the suspension to obtain "expandable graphite," which is essentially a mass of dried GIC or dried graphite oxide particles. Upon exposure of expandable graphite to a temperature in the range of typically 800-1,050° C. for approximately 30 seconds to 2 minutes, the GIC undergoes a rapid expansion by a factor of 30-300 to form "graphite worms" (24 or 104), which are each a collection of exfoliated, but largely un-separated or still interconnected graphite flakes. A SEM image of graphite worms is presented in FIG. 2(a).

In Route 1A, these graphite worms (exfoliated graphite or "networks of interconnected/non-separated graphite flakes")

can be re-compressed to obtain flexible graphite sheets or foils (26 or 106) that typically have a thickness in the range of 0.125 mm (125 µm)-0.5 mm (500 µm). One may choose to use a low-intensity air mill or shearing machine to simply break up the graphite worms for the purpose of producing the so-called "expanded graphite flakes" (108) which contain mostly graphite flakes or platelets thicker than 100 nm (hence, not a nano material by definition).

Exfoliated graphite worms, expanded graphite flakes, and the recompressed mass of graphite worms (commonly referred to as flexible graphite sheet or flexible graphite foil) are all 3-D graphitic materials that are fundamentally different and patently distinct from either the 1-D nano carbon material (CNT) or the 2-D nano carbon material (graphene).

As disclosed by M. Smalc, et al, U.S. Pat. No. 7,292,441 (Nov. 6, 2007) and U.S. Pat. No. 6,982,874 (Jun. 3, 2006), and J. W. Tzeng, U.S. Pat. No. 6,482,520 (Nov. 19, 2002), these flexible graphite (FG) foils can be used as a heat spreader material, but exhibiting a maximum in-plane thermal conductivity of typically less than 500 W/mK (more typically <300 W/mK) and in-plane electrical conductivity no greater than 1,500 S/cm. These low conductivity values are a direct result of the many defects, wrinkled or folded graphite flakes, interruptions or gaps between graphite flakes, and non-parallel flakes (e.g. SEM image in FIG. 2(*b*)). Many flakes are inclined with respect to one another at a very large angle (e.g. mis-orientation of 20-40 degrees).

In Route 1B, the exfoliated graphite is subjected to high-intensity mechanical shearing (e.g. using an ultrasonicator, high-shear mixer, high-intensity air jet mill, or high-energy ball mill) to form separated single-layer and multi-layer graphene sheets (collectively called NGPs, 33 or 112), as disclosed in our U.S. application Ser. No. 10/858,814. Single-layer graphene can be as thin as 0.34 nm, while multi-layer graphene can have a thickness up to 100 nm. In the present application, the thickness of multi-layer NGPs is typically less than 20 nm.

Route 2 entails ultrasonicating the graphite oxide suspension for the purpose of separating/isolating individual graphene oxide sheets from graphite oxide particles. This is based on the notion that the inter-graphene plane separation has been increased from 0.335 nm in natural graphite to 0.6-1.1 nm in highly oxidized graphite oxide, significantly weakening the van der Waals forces that hold neighboring planes together. Ultrasonic power can be sufficient to further separate graphene plane sheets to form separated, isolated, or discrete graphene oxide (GO) sheets. These graphene oxide sheets can then be chemically or thermally reduced to obtain "reduced graphene oxides" (RGO) typically having an oxygen content of 0.01%-10% by weight, more typically 0.01%-5% by weight.

For the purpose of defining the claims of the instant application, NGPs include single-layer and multi-layer graphene or reduced graphene oxide with an oxygen content of 0-10% by weight, more typically 0-5% by weight, and preferably 0-2% weight. Pristine graphene has essentially 0% oxygen. Graphene oxide (including RGO) can have 0.01%-46% by weight of oxygen. The graphene oxide gel, to be described in detail later, typically contains 20-46% by weight oxygen. The graphene oxide gel-derived unitary graphene layer or graphene single crystal of the present invention typically has an oxygen content of 0.01% to 5% by weight, more typically less than 2% by weight.

It may be noted that flexible graphite foils (obtained by re-compressing exfoliated graphite worms) for electronic device thermal management applications (e.g. as a heat spreader) have the following major deficiencies:

(1) As indicated earlier, flexible graphite (FG) foils exhibit a relatively low thermal conductivity, typically <500 W/mK and more typically <300 W/mK.

(2) Flexible graphite foils are also of low strength and poor structural integrity. The high tendency for flexible graphite foils to get torn apart makes them difficult to handle in the process of integrating them in a microelectronic device.

(3) Another very subtle, largely ignored or overlooked, but critically important feature of FG foils is their high tendency to get flaky with graphite flakes easily coming off from FG sheet surfaces and emitting out to other parts of a microelectronic device. These highly electrically conducting flakes (typically 1-500 µm in lateral dimensions and >100 nm in thickness) can cause internal shorting and failure of electronic devices.

(4) For this reason, it is necessary to apply a protective resin coating onto a surface or on both surfaces of a flexible graphite foil in order to prevent graphite flakes from being released. This resin coating is typically not a thermally or electrically conductive material that is often an undesirable feature in a situation where high conductivity is required. In other situations where electrical insulation or isolation is required, this resin layer can present some issues (e.g. mis-match in coefficients of thermal expansion and elastic constants between the FG layer and the resin coating, resulting in delamination or peeling-off after some number of thermal cycles).

Other sheet-like graphitic materials that can be used as a heat spreader or thermal interface material include carbon nanotube (CNT) paper (e.g. Bucky paper), carbon fiber mat (e.g. carbon nanofiber or CNF mat), and carbon paper (e.g. made of short carbon fibers). These graphitic sheets also suffer from similar shortcomings as FG foils. For instance, although individual CNTs or CNFs alone can exhibit a high thermal conductivity (1,500-3000 W/mK), the resulting CNT or CNF paper or mat typically exhibit an in-plane thermal conductivity less than 100 W/mK and often less than 10 W/mK, likely due to the few and poor contacts between individual CNT or CNF filaments, providing insufficient cross-sections for electron flow or even impeding electron flow. Further, the contact between a sheet-like graphitic layer and a heat source is usually poor due to limited contact surfaces between such a graphitic layer (e.g. CNT paper) and a rigid device component (e.g. a CPU in a mobile phone). This results in an ineffective heat transfer between the heat source and the graphitic layer.

Similarly, the NGPs (including discrete platelets of pristine graphene and GRO), when packed into a film or paper sheet (34 or 114) of non-woven aggregates, typically do not exhibit a high thermal conductivity. The thermal conductivity is found to be higher than 1,000 W/mK only when the film or paper is cast and pressed into a sheet having a thickness lower than 10 µm, and higher than 1,500 W/mK only when the film or paper is cast and greatly pressed into a sheet having a thickness lower than 1 µm. This is reported in our earlier U.S. patent application Ser. No. 11/784,606 (Apr. 9, 2007). However, ultra-thin film or paper sheets (<10 µm) are difficult to produce in mass quantities, and difficult to handle when one tries to incorporate these thin films as a heat spreader material during the manufacturing of microelectronic devices. Further, thickness dependence of thermal conductivity (not being able to achieve a high thermal conductivity at a wide range of film thicknesses) is not a desirable feature.

In general, paper made from platelets of graphene, graphene oxide, and RGO (e.g. those paper sheets prepared by vacuum-assisted filtration process) exhibit many defects, wrinkled or folded graphene sheets, interruptions or gaps between platelets, and non-parallel platelets (e.g. SEM image in FIG. 3(b)), leading to poor thermal conductivity and electric conductivity. These papers or aggregates of discrete NGP, GO or RGO platelets also have a tendency to get flaky, emitting conductive particles into air.

Our earlier application (U.S. application Ser. No. 11/784,606) further disclosed a mat, film, or paper of NGPs infiltrated with a metal, glass, ceramic, resin, and CVD graphite matrix material. Later on, Haddon, et al (US Pub. No. 2010/0140792, Jun. 10, 2010) also reported NGP thin film and NGP-polymer composites for thermal management applications. The processes used by Haddon et al to produce NGPs are identical to those disclosed much earlier by us (Jang, et al. U.S. patent application Ser. No. 10/858,814 (Jun. 3, 2004)). The NGP-polymer composites, as an intended thermal interface material, have very low thermal conductivity, typically <<2 W/mK. The NGP films of Haddon, et al are essentially non-woven aggregates of discrete graphene platelets, identical to those of our earlier invention (U.S. application Ser. No. 11/784,606). Again, these aggregates have a great tendency to have graphite particles flaking and separated from the film surface, creating internal shorting problem for the electronic device containing these aggregates. They also exhibit low thermal conductivity unless made into thin films (10 nm-300 nm, as reported by Haddon, et al) which are very difficult to handle in a real device manufacturing environment. Balandin, et al (US Pub. No. 2010/0085713, Apr. 8, 2010) also disclosed a graphene layer produced by CVD deposition or diamond conversion for heat spreader application. More recently, Kim, et al (N. P. Kim and J. P. Huang, "Graphene Nanoplatelet Metal Matrix," US Pub. No. 2011/0108978, May 10, 2011) reported metal matrix infiltrated NGPs. However, metal matrix material is too heavy and the resulting metal matrix composite does not exhibit a high thermal conductivity.

Another prior art material for thermal management application is the pyrolitic graphite film. The lower portion of FIG. 1(a) illustrates a typical process for producing prior art pyrolitic graphitic films or sheets from a polymer. The process begins with carbonizing a polymer film 46 at a carbonization temperature of 500-1,000° C. for 2-10 hours to obtain a carbonized material 48, which is followed by a graphitization treatment at 2,500-3,200° C. for 5-24 hours to form a graphitic film 50. This is a slow, tedious, and energy-intensive process. Furthermore, carbonization of certain polymers (e.g. polyacrylonitrile) involves the emission of toxic species.

Another type of pyrolytic graphite is produced by high temperature decomposition of hydrocarbon gases in vacuum followed by deposition of the carbon atoms to a substrate surface. This is essentially a chemical vapor deposition (CVD) process. In particular, highly oriented pyrolitic graphite (HOPG) is the material produced by the application of uniaxial pressure on deposited pyrocarbon or pyrolytic graphite at very high temperatures (typically 3,000-3,300° C.). This entails a thermo-mechanical treatment of combined mechanical compression and ultra-high temperature for an extended period of time in a protective atmosphere; a very expensive, energy-intensive, and technically challenging process. The process requires high vacuum and ultra-high temperature equipment that is not only very expensive to make but also very expensive and difficult to maintain. Even with such extreme processing conditions, the resulting PG (including HOPG) still possesses many defects, grain boundaries, and mis-orientations (neighboring graphene planes not parallel to each other), resulting in less-than-satisfactory in-plane properties. Typically, the best prepared HOPG sheet or block remains far from being a graphite single crystal; instead, it typically still contains many grains or single crystals and a vast amount of grain boundaries and defects. In general, the PG or HOPG is free from any element than carbon.

Similarly, the most recently reported graphene thin film (<2 nm) prepared by catalytic CVD of hydrocarbon gas (e.g. $C_2H_4$) on Ni or Cu surface is not a single-grain crystal, but a poly-crystalline structure with many grain boundaries and defects [e.g., Piran R. Kidambi, et al., "The Parameter Space of Graphene Chemical Vapor Deposition on Polycrystalline Cu," *The Journal of Physical Chemistry C* 2012 116 (42), 22492-22501]. With Ni or Cu being the catalyst, carbon atoms obtained via decomposition of hydrocarbon gas molecules at 800-1,000° C. are deposited onto Ni or Cu foil surface to form a sheet of single-layer or few-layer graphene that is poly-crystalline. The grains are typically much smaller than 100 μm in size and, more typically, smaller than 10 μm in size. These graphene thin films, being optically transparent and electrically conducting, are intended for touch screen (to replace indium-tin oxide or ITO glass) or semiconductor (to replace silicon, Si) applications. However, these polycrystalline graphene films are not sufficiently thermally conducting (too many grains or too much grain boundaries, and all grains being oriented in different directions) and not sufficiently thick for use as a heat spreader in an electronic device.

Thus, it is an object of the present invention to provide a graphene oxide (GO) gel-derived unitary or monolithic film, which exhibits a thermal conductivity comparable to or greater than that of the PG, HOPG, or CVD graphene film.

It is a specific object of the present invention to provide a GO gel-derived unitary or monolithic entity, which has the following characteristics (separately or in combination): (1) This unitary entity is an integrated graphene object that is either a graphene single crystal (single grain only) or a poly-crystal (multiple grains but having incomplete grain boundaries) with all graphene planes in all grains being essentially oriented parallel to one another (the crystallographic c-axis of all grains being essentially parallel to one another). (2) This integrated graphene entity is not an aggregate or stack of multiple discrete graphite flakes or discrete platelets of graphene or GO, and does not contain any discernible or discrete flake/platelet. (3) This integrated graphene entity is not made by gluing or bonding discrete flakes/platelets together with a binder, linker, or adhesive. Instead, GO molecules in the GO gel are merged, mainly edge-to-edge through joining or forming of covalent bonds with one another, into an integrated graphene entity, without using any externally added linker or binder molecules or polymers. (4) This unitary or monolithic graphene entity (a single crystal or poly-crystal with all graphene planes having crystallographic c-axis essentially parallel to each other) is derived from a GO gel, which is in turn obtained from heavy oxidation of natural graphite or artificial graphite particles originally having multiple graphite crystallites. Prior to being chemically oxidized to become GO gel, these starting graphite crystallites have an initial length ($L_a$ in the crystallographic a-axis direction), initial width ($L_b$ in the b-axis direction), and thickness ($L_c$ in the c-axis direction). This unitary graphene entity typically has a length or width significantly greater than the $L_a$ and $L_b$ of the original crystallites.

The present invention also provides a method or process for producing such a GO gel-derived unitary or monolithic graphene entity, or a graphene single crystal (including a graphene poly-crystal with an incomplete grain boundary). The process begins with preparation of a mass of GO gel preferably in a layer form (preferably less than 10 mm in thickness, more preferably less than 1 mm, and most preferably less than 500 µm in thickness prior to drying). The liquid component of this GO gel is then partially or totally removed and, concurrently or sequentially, this GO layer is thermally converted to an integrated graphene film obtained by heat-treating graphene oxide gel to chemically merge individual graphene oxide molecules primarily in an edge-to-edge manner.

Another object of the present invention is to provide a cost-effective process of producing GO-derived graphene monolith that exhibits a combination of exceptional thermal conductivity, electrical conductivity, mechanical strength, surface hardness, and scratch resistance unmatched by any thin-film graphitic material of comparable thickness range.

In particular, the present invention provides a process for producing a unitary or monolithic graphene layer or graphene single crystal from a GO gel. This process does not involve or require an ultrahigh temperature as is absolutely required of the processes for producing pyrolytic graphite (including HOPG) from either carbonized polymers (e.g. polyimide) or using the CVD deposition. The presently invented process is simple, less energy-intensive, and highly scalable.

This thermally and electrically conductive graphene monolith can be used for thermal management applications (e.g. for use as a heat spreader) in a microelectronic device, such as a mobile phone (including a smart phone), a notebook computer, a tablet, an e-book, a telecommunication device, and any hand-held computing device or portable microelectronic device.

It is another object of the present invention to provide a GO-derived unitary graphene entity that exhibits a combination of exceptional thermal conductivity, electrical conductivity, mechanical strength, surface smoothness, surface hardness, and scratch resistance unmatched by any thin-film material of comparable thickness range.

It is a specific object of the present invention to provide a highly conductive graphene monolith thin-film sheet that meets the following technical requirements (a) in-plane thermal conductivity greater than 600 W/mK (preferably greater than 1,000 W/mK, and further preferably greater than 1,700 W/mK); (b) in-plane electrical conductivity greater than 2,000 S/cm (preferably >3,000 S/cm, more preferably >5,000 S/cm, and most desirably >10,000 S/cm); (c) Rockwell surface hardness value >60 (preferably >80); and/or (d) a tensile strength greater than 10 MPa (preferably >40 MPa, more preferably >60 MPa, and most preferably >100 MPa).

SUMMARY OF THE INVENTION

The present invention provides a unitary graphene layer or graphene single crystal containing closely packed and bonded parallel graphene planes having an inter-graphene plane spacing of 0.335 to 0.40 nm and an oxygen content of 0.01% to 10% by weight. This unitary graphene layer or graphene single crystal is obtained from heat-treating a graphene oxide gel at a temperature higher than 100° C., wherein an average mis-orientation angle between two graphene planes is less than 10 degrees, preferably and typically less than 5 degrees. The thickness of this unitary graphene entity or graphene single crystal is typically greater than 1 nm, and more typically greater than 10 nm (optically opaque), and further more typically greater than 10 µm for thermal management applications.

The graphene single crystal herein refers to the single-grain or single-domain graphene or poly-crystalline structure (but having an incomplete grain boundary) in which all the graphene planes in all grain(s) are essentially parallel to one another.

The graphene oxide gel-derived unitary or monolithic graphene layer or graphene single crystal has a unique combination of outstanding thermal conductivity, electrical conductivity, mechanical strength, scratch resistance, and elimination of the possibility of having surface graphite flakes or particles to "flake off" (actually, there is no discrete flake/platelet to be peeled therefrom).

The graphene oxide (GO) gel-derived unitary or monolithic entity has the following characteristics (separately or in combination):

(1) This unitary entity is an integrated graphene object that is either a graphene single crystal or a poly-crystal having multiple grains (but with incomplete or poorly delineated grain boundaries). This unitary graphene entity is composed of multiple graphene planes that are essentially oriented parallel to one another. Specifically, the crystallographic c-axis directions of all the graphene planes in all grains are essentially parallel to one another.

(2) In contrast to the paper-like sheets of expanded graphite flakes or graphene platelets (e.g. those prepared by a paper-making process), this integrated graphene entity is not an aggregate or stack of multiple discrete graphite flakes or discrete platelets of graphene, GO, or RGO. This is a single graphene entity or monolith, not a simple aggregate of multiple graphite flakes (FG foil) or graphene sheets (graphene paper). This unitary graphene entity does not contain discrete graphite flakes or discrete nano graphene platelets (platelets of pristine graphene, graphene oxide, and reduced graphene oxide) dispersed therein.

(3) In other words, this graphene monolith is not the result of exfoliating the graphene sheets or graphite flakes (that constitute the original structure of graphite particles) and then simply re-orienting these discrete sheets/flakes along one direction. Such an aggregating procedure leads to a simple collection or stack of discrete flakes/sheets/platelets that can be detected or discerned with an un-assisted eye or under a low-magnification optical microscope (×100-×1000).

Contrarily, the original graphite particles are heavily oxidized, to the extent that practically every one of the original graphene planes has been oxidized and isolated from one another to become individual molecules that possess highly reactive functional groups at the edge and, mostly, on graphene planes as well. These individual hydrocarbon molecules (containing elements such as O and H, not just carbon atoms) are dissolved in the reaction medium (e.g. mixture of water and acids) to form a gel-like mass, herein referred to as GO gel. This gel is then cast onto a smooth substrate surface, with the liquid components removed to form a dried GO layer. When properly dispersed and heated on a solid substrate surface, these highly reactive molecules react and join with one another mostly in lateral directions along graphene planes (in an edge-to-edge manner) and, in some cases, between graphene planes as well. These linking and merging reactions proceed in such a manner that the molecules are chemically merged, linked, and integrated into one single entity or monolith (not just physically stacked or packed together). The molecules completely lose their own original identity and they no longer are discrete sheets/platelets/flakes. There is only one single layer-like structure (unitary graphene entity) that is essentially one huge molecule or just a few giant molecules with an essentially infinite molecular weight. This may also be described as a graphene single crystal (with only one grain in the entire structure or entity, or a poly-crystal having several grains, but typically no discernible, well-defined grain boundaries, e.g. FIG. 3(f)). All the constituent graphene planes are very large in lateral dimensions (length and width) and are essentially parallel to one another.

In-depth X-ray diffraction, atomic force microscopy, and electron microscopy (including selected area diffraction) studies indicate that the graphene monolith is composed of several huge graphene planes (with length/width typically >>100 μm, more typically >>1 mm, and most typically >>1 cm). These giant graphene planes are stacked and bonded along the thickness direction (crystallographic c-axis direction) through not just the van der Waals forces in conventional graphite crystallites, but also covalent bonds, Not to be limited by theory, but the studies based on combined Raman, FTIR, and electron spectroscopy for chemical analysis (ESCA) appear to indicate the co-existence of $sp^2$ (dominating) and $sp^3$ (weak but existing) electronic configurations, not just the conventional $sp^2$ alone in graphite.

(4) This integrated graphene entity is not made by gluing or bonding discrete flakes/platelets together with a binder, linker, or adhesive. Instead, GO molecules in the GO gel are merged, mainly edge-to-edge through joining or forming of covalent bonds with one another, into an integrated graphene entity, without using any externally added linker or binder molecules or polymers.

(5) This unitary or monolithic graphene entity is a single crystal or poly-crystal (having poorly defined or incomplete grain boundaries) with the crystallographic c-axis in all grains being essentially parallel to each other. This entity is derived from a GO gel, which is in turn obtained from natural graphite or artificial graphite particles originally having multiple graphite crystallites. Prior to being chemically oxidized, these starting graphite crystallites have an initial length ($L_a$ in the crystallographic a-axis direction), initial width ($L_b$ in the b-axis direction), and thickness ($L_c$ in the c-axis direction). The resulting unitary graphene entity typically has a length or width significantly greater than the $L_a$ and $L_b$ of the original crystallites. The length/width of this unitary graphene entity or that of a graphene single crystal is typically greater than the $L_a$ and $L_b$ of the original crystallites. Even the individual grains in a poly-crystalline unitary graphene entity have a length or width significantly greater than the $L_a$ and $L_b$ of the original crystallites. They can be as large as the length or width of the unitary graphene entity itself, not just 2 or 3 times higher than the initial $L_a$ and $L_b$ of the original crystallites.

The graphene oxide-derived monolithic graphene layer preferably has a thickness less than 200 μm for a heat spreader application, but it can be thicker. Further preferably, the monolithic graphene layer or graphene single crystal has a thickness greater than 1 μm, but less than 200 μm. In some applications, the thickness is preferably greater than 10 μm. The thickness range of 20-100 μm is particularly useful for mobile device thermal management applications.

The unitary graphene sheet of the present invention has overcome all the major problems associated with the flexible graphite foil produced by re-compression of exfoliated graphite worms or exfoliated graphite flakes of natural graphite and/or artificial graphite. The flexible graphite sheet or foil prepared by re-compressing (e.g. roll-pressing) exfoliated graphite worms or flakes has a great tendency to flake off, emitting graphite flakes into air and eventually relocating to a dangerous spot (e.g. where the presence of graphite flakes could cause internal short-circuiting). Further, flexible graphite sheets or foils are relatively brittle and weak, and hence are difficult to handle in an actual microelectronic device manufacturing environment. They also do not possess high thermal conductivity (most typically <300 W/mK). These and other major issues associated with the use of flexible graphite sheets in a microelectronic device for a thermal management purpose have been effectively overcome surprisingly by the presently invented unitary graphene body.

The unitary graphene sheet is derived from a graphene oxide gel, which is produced from particles of natural graphite or artificial graphite composed of multiple graphite crystallites. These crystallites typically have an initial length $L_a$ (in the crystallographic a-axis direction) of less than 100 μm (more typically less than 10 μm), an initial width $L_b$ in the b-axis direction also of more typically less than 10 μm, and a thickness $L_c$ in the c-axis direction (typically 0.2 to 10 μm). However, the presently invented GO-derived unitary graphene layer or graphene single crystal typically has a length or width at least greater than twice (more typically significantly greater than 3 times) the initial $L_a$ or twice (more typically >3 times) the $L_b$ of the graphite crystallites of the starting materials. The unitary graphene layer or graphene single crystal typically has a length or width no less than 10 μm, more typically no less than 100 μm, and even more typically no less than 1 cm. They often are extended to cover the entire width of the original GO gel layer deposited on a substrate surface, which can be >100 cm as desired.

As a preferred processing condition for the unitary graphene layer or graphene single crystal, the heat-treating temperature for GO is from 100° C. to 1,000° C. and the unitary graphene layer or graphene single crystal has a thermal conductivity greater than 600 W/mK or electrical conductivity greater than 2,000 S/cm. Alternatively, the heat-treating temperature is from 1,000° C. to 1,500° C. and the resulting unitary graphene layer or graphene single crystal typically has a thermal conductivity greater than 1,300 W/mK or electrical conductivity greater than 3,000 S/cm. With a heat-treating temperature of from 1500° C. to 2,500° C., the unitary graphene layer or graphene single crystal has a thermal conductivity greater than 1,600 W/mK or electrical conductivity greater than 5,000 S/cm (or even >8,000 S/cm). With a heat-treating temperature of from 2,500° C. to 3,250° C., the unitary graphene layer or graphene single crystal has a thermal conductivity greater than 1,700 W/mK or electrical conductivity greater than 8,000 S/cm (typically greater than 10,000 S/cm and, in many cases, greater than 15,000 S/cm).

The unitary graphene layer or graphene single crystal can have a thickness as low as 1 nm, but preferably >10 nm, more preferably >1 μm, even more preferably >10 μm. For use as a heat spreader, the thickness is typically in the range of 10-200 μm, but most typically or desirably between 20 and 100 μm. As indicated earlier, the unitary graphene layer or graphene single crystal typically has a lateral dimension (length or width) significantly greater than 100 μm.

The unitary graphene layer or graphene single crystal typically has an oxygen content from 0.01% to 5% by weight, more typically from 0.01% to 2% by weight. If the re-graphitization temperature exceeds 2,000° C. and is conducted under very strict protective atmosphere or extremely high vacuum conditions, one can essentially eliminate oxygen.

For the preparation of the unitary graphene layer or graphene single crystal, the graphene oxide gel is composed of graphene oxide molecules dispersed in an acidic medium having a pH value of no higher than 5 and the graphene oxide molecules have an oxygen content no less than 20% by weight while in a gel state.

The GO gel is obtained by immersing a graphitic material in a powder or fibrous form (e.g. natural or artificial graphite powder or graphite fibers) in an oxidizing liquid medium in a reaction vessel at a reaction temperature for a length of time sufficient to obtain a graphene oxide gel composed of graphene oxide molecules dispersed in the liquid medium. The graphene oxide molecules preferably and typically have an oxygen content no less than 20% by weight (typically 20%-46% by weight of oxygen) and a molecular weight less than 43,000 g/mole while in a gel state. Preferably, graphene oxide molecules have a molecular weight less than 4,000 g/mole while in a gel state, more preferably between 200 g/mole and 4,000 g/mole while in a gel state.

The unitary graphene layer or graphene single crystal is produced by depositing a layer of graphene oxide gel onto a surface of a substrate and removing the residual liquid from this layer of deposited graphene oxide gel. This is followed by subjecting this graphene-oxide layer to a heat treatment temperature of at least 100-150° C. for thermal reduction and/or re-graphitization. A good heat treatment temperature is from 300° C. to 1,500° C. for re-graphitization. Although not required, the heat treatment temperature may be higher than 1,500° C. for re-graphitization, or may be in the range of from 1,500° C. to 2,500° C. A temperature higher than 2,500° C. may be used if so desired.

The starting materials for the preparation of graphene oxide gel include a graphitic material selected from natural graphite, artificial graphite, mesophase carbon, mesophase pitch, mesocarbon microbead, soft carbon, hard carbon, coke, carbon fiber, carbon nanofiber, carbon nanotube, or a combination thereof.

The unitary graphene layer or graphene single crystal with a thickness greater than 200 μm shows a surprisingly high Rockwell hardness value, typically greater than 60 and often greater than 100. This is unprecedented since prior art flexible graphite foil, pyrolytic graphite, or bulk graphite does not show such a high hardness.

The unitary graphene layer or graphene single crystal of the present invention can exhibit an electrical conductivity greater than 1,500 S/cm, a thermal conductivity greater than 600 W/mK, a physical density greater than 1.8 g/cm3, and/or a tensile strength greater than 40 MPa.

With a higher re-graphitization temperature, the graphene monolithic can have an electrical conductivity greater than 3,000 S/cm, a thermal conductivity greater than 1,000 W/mK, a physical density greater than 2.0 g/cm3, and/or a tensile strength greater than 80 MPa. It can even exhibit an electrical conductivity greater than 5,000 S/cm, a thermal conductivity greater than 1,500 W/mK, a physical density greater than 2.1 g/cm$^3$, and/or a tensile strength greater than 100 MPa.

The present invention also provides a process for producing the aforementioned unitary graphene layer or graphene single crystal. The process comprises: (a) preparing a graphene oxide gel having graphene oxide molecules dispersed in a fluid medium, wherein the graphene oxide gel is optically transparent or translucent; (b) depositing a layer of the graphene oxide gel onto a surface of a supporting substrate to form a deposited graphene oxide gel thereon; (c) partially or completely removing the fluid medium from the deposited graphene oxide gel layer to form a graphene oxide layer; and (d) heat-treating the graphene oxide layer to form the unitary graphene layer or graphene single crystal. The process further comprises a step of compressing the graphene oxide layer (e.g. via roll-pressing through a set or multiple sets of rollers).

In particular, the graphene oxide gel is prepared by immersing a graphitic material in a powder or fibrous form in an oxidizing liquid to form an initially optically opaque suspension in a reaction vessel at a reaction temperature for a length of time sufficient to obtain a graphene oxide gel that is optically transparent or translucent. The graphene oxide gel is composed of graphene oxide molecules dispersed in an acidic medium having a pH value of no higher than 5 and the graphene oxide molecules have an oxygen content no less than 20% by weight (typically from 20% to approximately 46% by weight.

Typically, the graphene oxide gel is prepared by immersing a graphitic material in an oxidizing agent to form an initially optically opaque suspension and allowing an oxidizing reaction to proceed until an optically transparent or translucent solution is formed. The graphitic material is selected from natural graphite, artificial graphite, mesophase carbon, mesophase pitch, mesocarbon microbead, soft carbon, hard carbon, coke, carbon fiber, carbon nanofiber, carbon nanotube, or a combination thereof.

The process is preferably a roll-to-roll process, wherein steps (b) and (c) include feeding a sheet of a solid substrate material from a roller to a deposition zone, depositing a layer of graphene oxide gel onto a surface of the sheet of solid substrate material to form a graphene oxide gel layer thereon, drying the graphene oxide gel to form a dried graphene oxide layer deposited on the substrate surface, and collecting graphene oxide layer-deposited substrate sheet on a collector roller. The process preferably includes an additional step of compressing the graphene oxide layer prior to being collected on the collector roller.

This graphene oxide gel has the characteristics that it is optically transparent or translucent and visually homogeneous with no discernible discrete graphene or graphene oxide sheets dispersed therein. In contrast, conventional suspension of discrete graphene or graphene oxide sheets, or graphite flakes looks opaque, dark, black or heavy brown in color with individual graphene sheets, graphene oxide sheets, or graphite flakes being discernible or recognizable with naked eyes.

The graphene oxide molecules dissolved in the liquid medium of a graphene oxide gel are aromatic chains that have an average number of benzene rings in the chain typically less than 1000, more typically less than 500, and most typically less than 100. Most of the molecules have more than 5 or 6 benzene rings (mostly >10 benzene rings) from combined atomic force microscopy, high-resolution TEM, and molecular weight measurements. These benzene-ring type of aromatic molecules have been heavily oxidized and contain functional groups, such as —COOH and —OH and, therefore, are "soluble" (not just dispersible) in polar solvents, such as water.

These soluble molecules behave like resins and are surprisingly capable of forming a coherent layer of graphene oxide of good structural integrity and high thermal conductivity. By contrast, conventional discrete graphene or graphene oxide sheets and graphite flakes do not have any self-adhesion or cohesion power. These sheets or flakes would just form a loosely packed mass of un-bonded particles that does not have any structural integrity.

The present invention also provides a heat spreader or heat sink product for use in a hand-held device, such as a power tool, a microelectronic or telecommunication device (e.g. mobile phone, tablet, laptop computer, LCD display, etc), a light-emitting diode (LED) lighting device or system. The light weight (lower density compared to metal and ceramic materials), exceptional thermal conductivity, relatively high structural integrity, superior surface hardness and scratch resistance, and eliminated or significantly reduced tendency to emit free graphite or carbon particles into air make the invented graphene oxide-coated graphitic layer an ideal thermal management material.

In summary, the present invention provides a unitary graphene layer for heat-spreading applications. In one preferred embodiment, this graphene monolith contains closely packed, gap-free, and chemically bonded parallel graphene planes that have an inter-graphene plane spacing of 0.335 to 0.50 nm (more typically 0.336 to 0.50 nm) and an oxygen content less than 1% by weight. The unitary graphene layer typically has a thickness greater than 10 nm, contains no discrete graphite flake or graphene platelet dispersed therein, and has an average mis-orientation angle between two graphene planes less than 10 degrees. This graphene monolith is obtained from heat-treating a graphene oxide gel at a temperature higher than 500° C.

Another preferred embodiment of the present invention is a unitary graphene layer (particularly useful for heat-spreading applications) that contains closely packed and chemically bonded parallel graphene planes having an inter-graphene plane spacing of 0.335 to 0.50 nm and an oxygen content less than 1% by weight (typically from 0.001% to 1%). This unitary graphene layer or monolith contains a poly-crystal or poly-grain structure that has an incomplete grain boundary, contains no discrete graphite flake or graphene platelet dispersed therein, and is obtained from heat-treating a graphene oxide gel at a temperature higher than 500° C.

DESCRIPTION OF THE PREFERRED EMBODIMENTS

Figure 1A:
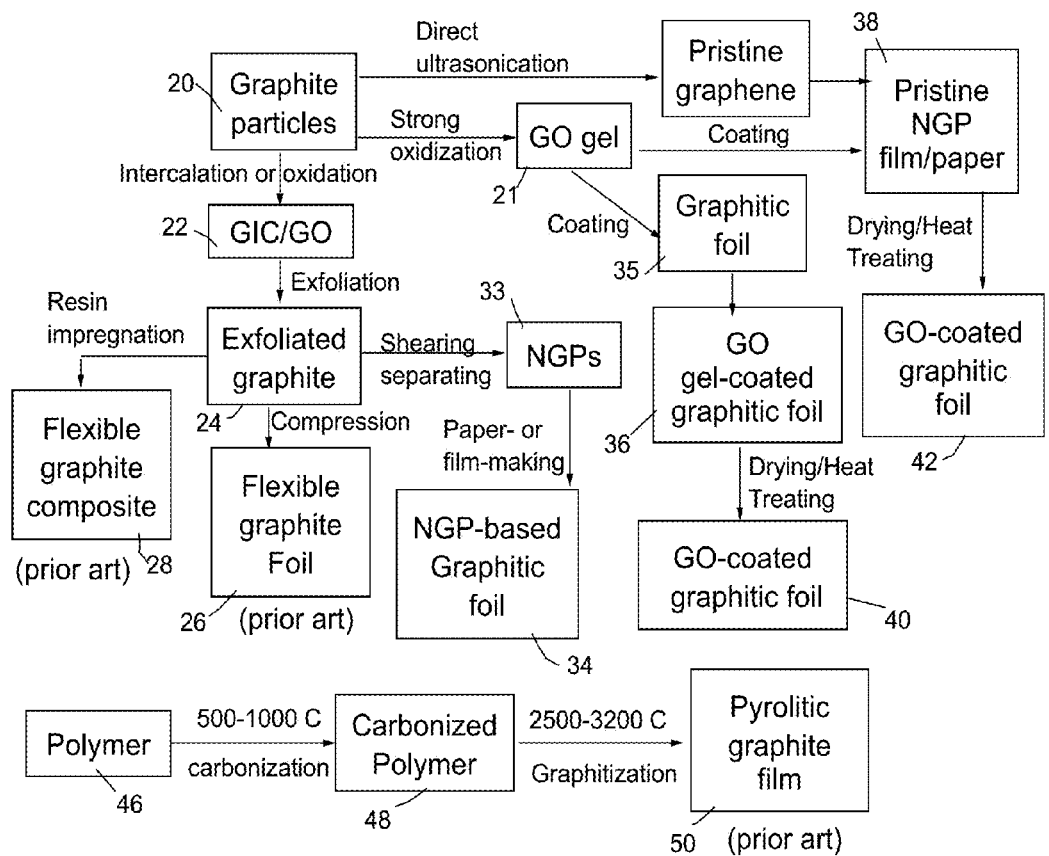
FIG. 1(a) A flow chart illustrating various prior art processes of producing exfoliated graphite products (flexible graphite foils and flexible graphite composites) and pyrolytic graphite (bottom portion), along with processes for producing graphene oxide gel and GO gel-coated laminates.

The present invention provides a unitary graphene layer (graphene monolith) or graphene single crystal containing closely packed and chemically bonded graphene planes that run essentially parallel to each other. These graphene planes cover a wide area with the length and width capable of being extended to cover the entire specimen length or width. This graphene monolith has an inter-graphene plane spacing of 0.335 to 0.40 nm as determined by X-ray diffraction, and an oxygen content of 0.01% to 10% by weight. This unitary graphene layer or graphene single crystal is obtained from heat-treating a graphene oxide gel at a temperature higher than 100° C., typically higher than 150° C., and more typically in the range of 1,000° C. to 1,500° C. Although not necessary, the heat treatment temperature can go above 1,500° C., even above 2,500° C. The average miss-orientation angle between two graphene planes in this graphene monolith is less than 10 degrees, preferably and typically less than 5 degrees. Most of the graphene layers are essentially parallel to one another with zero mis-orientation angle. In contrast, the mis-orientation angles in conventional flexible graphite sheets are significantly higher than 10 degrees.

The graphene oxide (GO) gel-derived unitary or monolithic entity has the following characteristics (separately or in combination):

(1) This unitary graphene entity is an integrated graphene object that is either a graphene single crystal or a poly-crystal having multiple grains that are essentially oriented parallel to one another. The crystallographic c-axis directions of all grains and all their constituent graphene planes are essentially parallel to one another. It may be noted that the grains in a graphene poly-crystal have very poorly delineated or incomplete grain boundaries. These grains are essentially a single grain with some residual demarcation lines (e.g., FIG. 3(f)). Such type of graphene poly-crystal is best described as a graphene single crystal with some aligned but sporadic defects. This conclusion was drawn after an extensive investigation using a combination of SEM, TEM, selected area diffraction (with a TEM), X-ray diffraction, atomic force microscopy (AFM), Raman spectroscopy, and FTIR.

(2) The paper-like sheets of expanded graphite flakes (flexible graphite foils) or graphene or GO platelet-based paper (e.g. those prepared by a paper-making process) are a simple, un-bonded aggregate/stack of multiple discrete graphite flakes or discrete platelets of graphene, GO, or RGO. In contrast, this unitary graphene entity is a fully integrated, single graphene entity or monolith containing no discrete flakes or platelets.

(3) In other words, this graphene monolith is not the result of exfoliating the graphene sheets or graphite flakes (that constitute the original structure of graphite particles) and then simply re-orienting these discrete sheets/flakes along one direction. The flakes or sheets of the resulting aggregates (paper, membrane, or mat) remain as discrete flakes/sheets/platelets even with an un-assisted eye or under a low-magnification optical microscope (×100-×1000).

Contrarily, for the preparation of the presently invented unitary graphene structure, the original graphite particles are heavily oxidized, to the extent that practically every one of the original graphene planes has been oxidized and isolated from one another to become individual molecules that possess highly reactive functional groups at the edge and, mostly, on graphene planes as well. These individual hydrocarbon molecules (containing elements such as O and H, in addition to carbon atoms) are dissolved in the reaction medium (e.g. mixture of water and acids) to form a gel-like mass, herein referred to as GO gel. This gel is then cast onto a smooth substrate surface and the liquid components are then removed to form a dried GO layer. When heated, these highly reactive molecules react and join with one another mostly in lateral directions along graphene planes (in an edge-to-edge manner) and, in some cases, between graphene planes as well. These linking and merging reactions proceed in such a manner that the molecules are merged, linked, and integrated into one single entity or monolith. The molecules completely lose their own identity and they no longer are discrete sheets/platelets/flakes. There is only one single layer-like structure (unitary graphene entity) that is one huge molecule or just a few giant molecules with an essentially infinite molecular weight. This may also be described as a graphene single crystal (with only one grain in the entire structure or entity, or a poly-crystal (with several grains, but typically no discernible, well-defined grain boundaries). All the constituent graphene planes are very large in lateral dimensions (length and width) and are essentially parallel to one another.

In-depth studies using a combination of SEM, TEM, selected area diffraction, X-ray diffraction, AFM, Raman spectroscopy, and FTIR indicate that the graphene monolith is composed of several huge graphene planes (with length/width typically >>100 μm, more typically >>1 mm, and most typically >>1 cm). These giant graphene planes are stacked and bonded along the thickness direction (crystallographic c-axis direction) through not just the van der Waals forces in conventional graphite crystallites, but also covalent bonds, Not to be limited by theory, but Raman and FTIR spectroscopy studies appear to indicate the co-existence of $sp^2$ (dominating) and $sp^3$ (weak but existing) electronic configurations, not just the conventional $sp^2$ alone in graphite.

(4) This integrated graphene entity is not made by gluing or bonding discrete flakes/platelets together with a binder, linker, or adhesive. Instead, GO molecules in the GO gel are merged, mainly edge-to-edge through joining or forming of covalent bonds with one another, into an integrated graphene entity, without using any externally added linker or binder molecules or polymers.

Figure 3A:
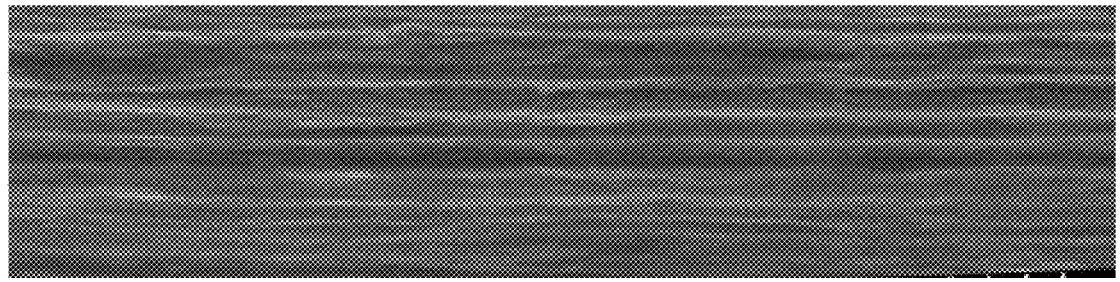
FIG. 3(a) A SEM image of a GO-derived graphene monolithic wherein multiple graphene sheets, originally 30 nm-2 μm in lateral dimension, have been oxidized, exfoliated, re-oriented, and seamlessly merged into continuous-length graphene sheets or layers that can run for hundreds of centimeters wide or long (only a 120 μm or 0.12 mm width of a 25-cm wide unitary graphene layer being shown in this SEM image)
Figure 3B:
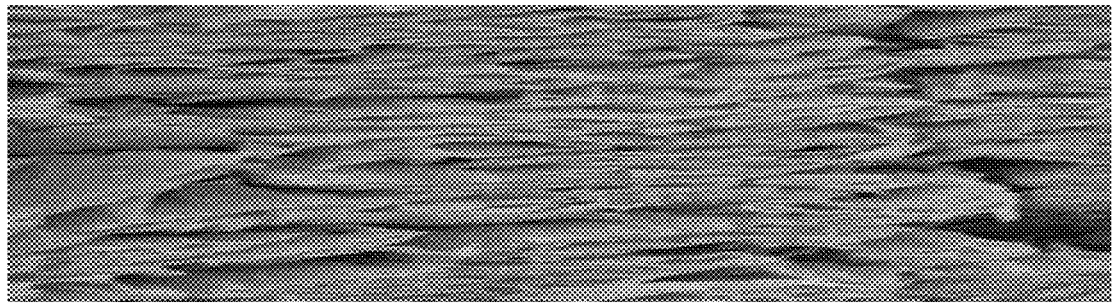
FIG. 3(b) A SEM image of a cross-section of a graphene paper/film prepared from discrete graphene sheets/platelets using a paper-making process (e.g. vacuum-assisted filtration). The image shows many discrete graphene sheets being folded or interrupted (not integrated), with orientations not parallel to the film/paper surface and having many defects or imperfections.
Figure 3C:
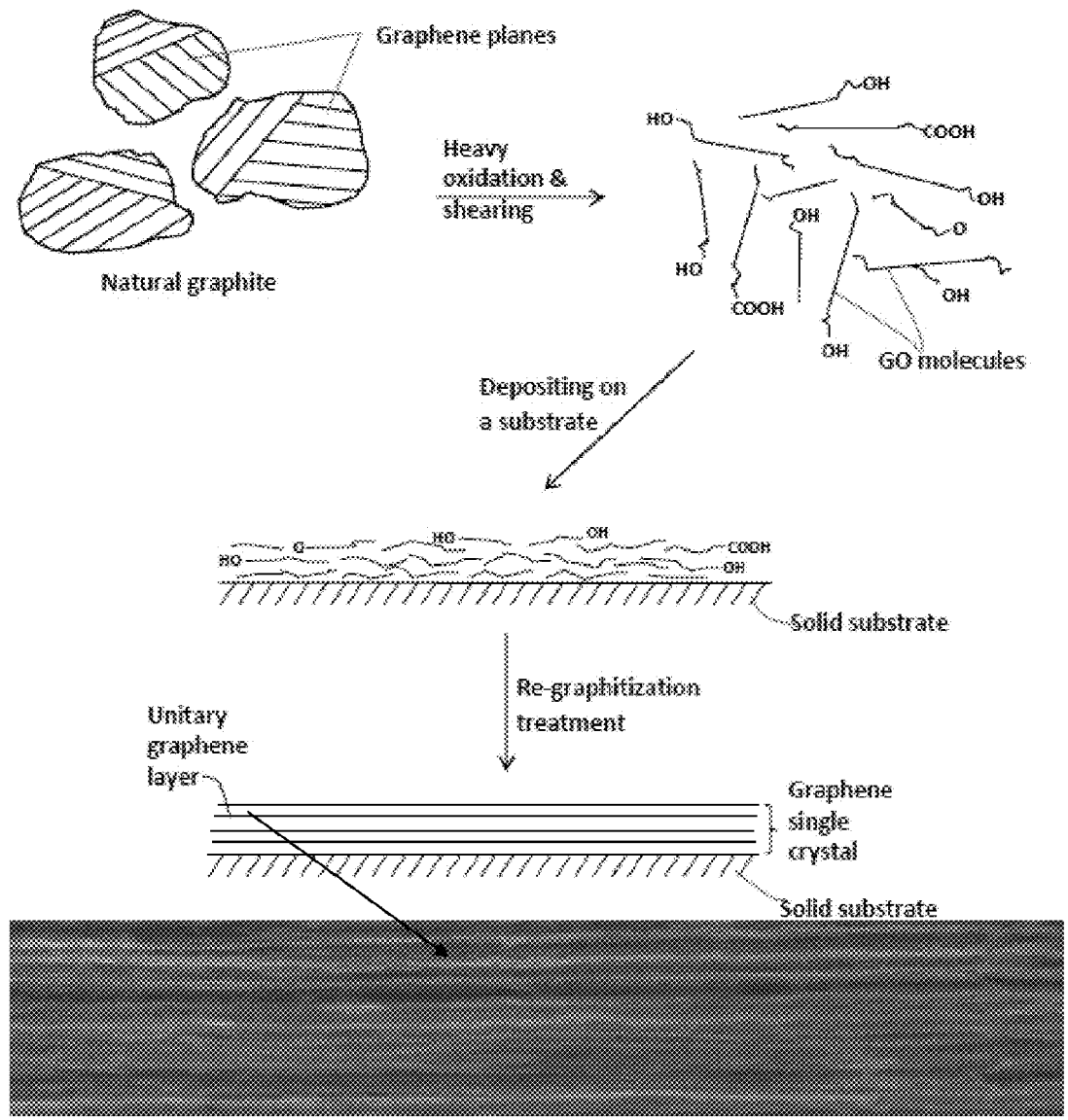
FIG. 3(c) Schematic drawing and an attendant SEM image to illustrate the formation process of a unitary graphene entity or graphene single crystal that is composed of multiple graphene planes that are parallel to one another and are chemically bonded in the thickness-direction or crystallographic c-axis direction.
Figure 3D:
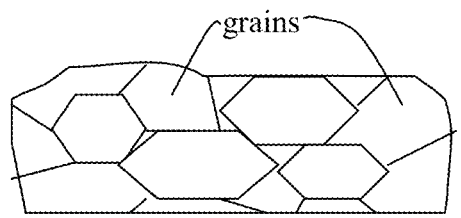
FIG. 3(d) Schematic of the prior art graphene poly-crystal obtained by CVD of hydrocarbon on a catalytic surface (e.g. Cu or Ni)
Figure 3E:
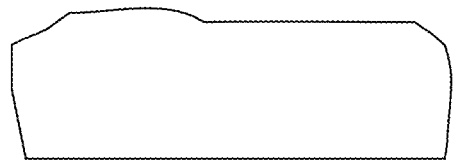
FIG. 3(e) Schematic of a graphene single crystal of the present invention.
Figure 3F:
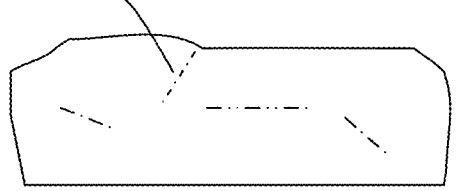
FIG. 3(f) Schematic of another graphene single crystal of the present invention (a "poly-crystal" with incomplete grain boundaries).

(5) This unitary or monolithic graphene entity is a single crystal (e.g. FIG. 3(e)) or poly-crystal (having incomplete grain boundaries, FIG. 3(f)) with the crystallographic c-axis in all grains being essentially parallel to each other. This entity is derived from a GO gel, which is in turn obtained from natural graphite or artificial graphite particles originally having multiple graphite crystallites. Prior to being chemically oxidized, these starting graphite crystallites have an initial length ($L_a$ in the crystallographic a-axis direction), initial width ($L_b$ in the b-axis direction), and thickness ($L_c$ in the c-axis direction). Upon heavy oxidation, these initially discrete graphite particles are chemically transformed into highly aromatic graphene oxide molecules having a significant concentration of edge- or surface-borne functional groups (e.g. —OH, —COOH, etc.). These aromatic GO molecules in the GO gel have lost their original identity of being part of a graphite particle or flake. Upon removal of the liquid component from the GO gel, the resulting GO molecules form an essentially amorphous structure. Upon heat treatment (re-graphitization treatment), these GO molecules are chemically merged and linked into a unitary or monolithic graphene entity.

The resulting unitary graphene entity typically has a length or width significantly greater than the $L_a$ and $L_b$ of the original crystallites. The length/width of this unitary graphene entity or that of a graphene single crystal is typically greater than the $L_a$ and $L_b$ of the original crystallites. Even the individual grains in a poly-crystalline unitary graphene entity have a length or width significantly greater than the $L_a$ and $L_b$ of the original crystallites. They can be as large as the length or width of the unitary graphene entity itself, not just 2 or 3 times higher than the initial $L_a$ and $L_b$ of the original crystallites.

(6) Due to these unique chemical composition (including oxygen content), morphology, crystal structure (including inter-graphene spacing), and structural features (e.g. defects, incomplete or lack of grain boundaries, chemical bonding and no gap between graphene sheets, and no interruptions in graphene planes), the graphene oxide gel-derived unitary or monolithic graphene layer has a unique combination of outstanding thermal conductivity, electrical conductivity, mechanical strength, and scratch resistance (including elimination of the tendency for surface graphite flakes or particles to "flake off" since there is essentially no discrete flake or platelet in this graphene monolith structure).

Figure 1B:
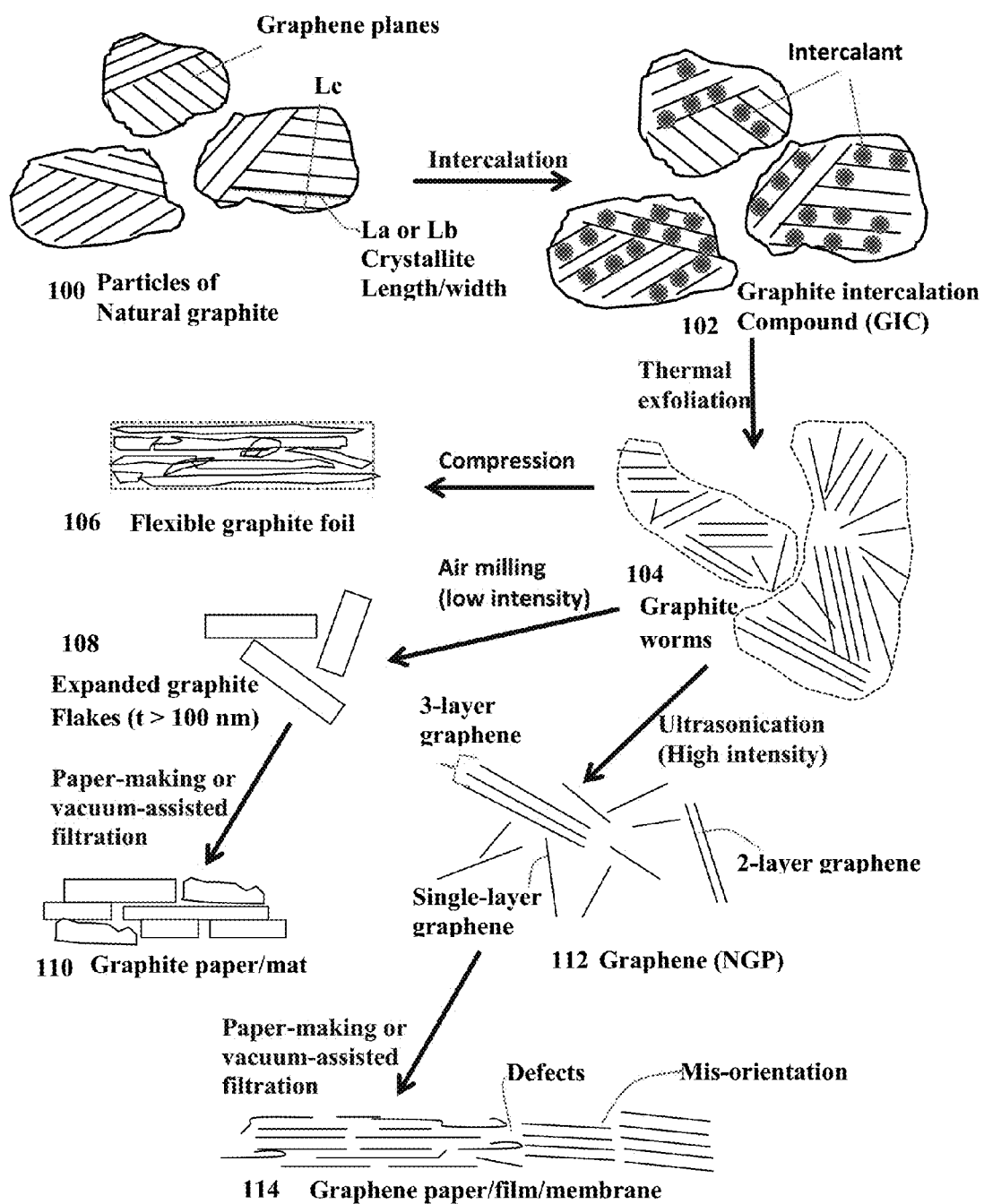
FIG. 1(b) Schematic drawing illustrating the processes for producing graphite or graphene oxide paper, mat, film, and membrane of simply aggregated flakes/platelets. All processes begin with intercalation and/or oxidation treatment of graphitic materials (e.g. natural graphite particles).

The aforementioned features are further described and explained in details as follows:

As illustrated in FIG. 1(b), a graphite particle (e.g. 100) is typically composed of multiple graphite crystallites or grains. A graphite crystallite is made up of layer planes of hexagonal networks of carbon atoms. These layer planes of hexagonally arranged carbon atoms are substantially flat and are oriented or ordered so as to be substantially parallel and equidistant to one another in a particular crystallite. These layers of carbon atoms, commonly referred to as graphene layers or basal planes, are weakly bonded together in their thickness direction (crystallographic c-axis direction) by weak van der Waals forces and groups of these graphene layers are arranged in crystallites.

The graphite crystallite structure is usually characterized in terms of two axes or directions: the c-axis direction and the a-axis (or b-axis) direction. The c-axis is the direction perpendicular to the basal planes. The a- or b-axes are the directions parallel to the basal planes (perpendicular to the c-axis direction).

A highly ordered graphite particle can consist of crystallites of a considerable size, having a length of $L_a$ along the crystallographic a-axis direction, a width of $L_b$ along the crystallographic b-axis direction, and a thickness $L_c$ along the crystallographic c-axis direction. The constituent graphene planes of a crystallite are highly aligned or oriented with respect to each other and, hence, these anisotropic structures give rise to many properties that are highly directional. For instance, the thermal and electrical conductivity of a crystallite are of great magnitude along the plane directions (a- or b-axis directions), but relatively low in the perpendicular direction (c-axis). As illustrated in the upper-left portion of FIG. 1(b), different crystallites in a graphite particle are typically oriented in different directions and, hence, a particular property of a multi-crystallite graphite particle is the directional average value of all the constituent crystallites.

Due to the weak van der Waals forces holding the parallel graphene layers, natural graphite can be treated so that the spacing between the graphene layers can be appreciably opened up so as to provide a marked expansion in the c-axis direction, and thus form an expanded graphite structure in which the laminar character of the carbon layers is substantially retained. The process for manufacturing flexible graphite is well-known and the typical practice is described in U.S. Pat. No. 3,404,061 to Shane et al., the disclosure of which is incorporated herein by reference. In general, flakes of natural graphite (e.g. 100 in FIG. 1(b)) are intercalated in an acid solution to produce graphite intercalation compounds (GICs, 102). The GICs are washed, dried, and then exfoliated by exposure to a high temperature for a short period of time. This causes the flakes to expand or exfoliate in the c-axis direction of the graphite up to 80-300 times of their original dimensions. The exfoliated graphite flakes are vermiform in appearance and, hence, are commonly referred to as worms 104. These worms of graphite flakes which have been greatly expanded can be formed without the use of a binder into cohesive or integrated sheets of expanded graphite, e.g. webs, papers, strips, tapes, foils, mats or the like (typically referred to as "flexible graphite" 106) having a typical density of about 0.04-2.0 g/cm³ for most applications.

The upper left portion of FIG. 1(a) shows a flow chart that illustrates the prior art processes used to fabricate flexible graphite foils and the resin-impregnated flexible graphite composite. The processes typically begin with intercalating graphite particles 20 (e.g., natural graphite or synthetic graphite) with an intercalant (typically a strong acid or acid mixture) to obtain a graphite intercalation compound 22

(GIC). After rinsing in water to remove excess acid, the GIC becomes "expandable graphite." The GIC or expandable graphite is then exposed to a high temperature environment (e.g., in a tube furnace preset at a temperature in the range of 800-1,050° C.) for a short duration of time (typically from 15 seconds to 2 minutes). This thermal treatment allows the graphite to expand in its c-axis direction by a factor of 30 to several hundreds to obtain a worm-like vermicular structure 24 (graphite worm), which contains exfoliated, but un-separated graphite flakes with large pores interposed between these interconnected flakes. An example of graphite worms is presented in FIG. 2(a).

In one prior art process, the exfoliated graphite (or mass of graphite worms) is re-compressed by using a calendering or roll-pressing technique to obtain flexible graphite foils (26 in FIG. 1(a) or 106 in FIG. 1(b)), which are typically much thicker than 100 µm. An SEM image of a cross-section of a flexible graphite foil is presented in FIG. 2(b), which shows many graphite flakes with orientations not parallel to the flexible graphite foil surface and there are many defects and imperfections.

Largely due to these mis-orientations of graphite flakes and the presence of defects, commercially available flexible graphite foils normally have an in-plane electrical conductivity of 1,000-3,000 S/cm, through-plane (thickness-direction or Z-direction) electrical conductivity of 15-30 S/cm, in-plane thermal conductivity of 140-300 W/mK, and through-plane thermal conductivity of approximately 10-30 W/mK. These defects and mis-orientations are also responsible for the low mechanical strength (e.g. defects are potential stress concentration sites where cracks are preferentially initiated). These properties are inadequate for many thermal management applications and the present invention is made to address these issues.

In another prior art process, the exfoliated graphite worm 24 may be impregnated with a resin and then compressed and cured to form a flexible graphite composite 28, which is normally of low strength as well. In addition, upon resin impregnation, the electrical and thermal conductivity of the graphite worms could be reduced by two orders of magnitude.

The exfoliated graphite may be subjected to high-intensity mechanical shearing/separation treatments using a high-intensity air jet mill, high-intensity ball mill, or ultrasonic device to produce separated nano graphene platelets 33 (NGPs) with all the graphene platelets thinner than 100 nm, mostly thinner than 10 nm, and, in many cases, being single-layer graphene (also illustrated as 112 in FIG. 1(b). An NGP is composed of a graphene sheet or a plurality of graphene sheets with each sheet being a two-dimensional, hexagonal structure of carbon atoms.

With a low-intensity shearing, graphite worms tend to be separated into the so-called "expanded graphite (108 in FIG. 1(b)), which can be formed into graphite paper or mat 106 using a paper- or mat-making process. This expanded graphite paper or mat 106 is just a simple aggregate or stack of discrete flakes having defects, interruptions, and mis-orientations between these discrete flakes.

For the purpose of defining the geometry and orientation of an NGP, the NGP is described as having a length (the largest dimension), a width (the second largest dimension), and a thickness. The thickness is the smallest dimension, which is no greater than 100 nm, preferably smaller than 10 nm in the present application. When the platelet is approximately circular in shape, the length and width are referred to as diameter. In the presently defined NGPs, both the length and width can be smaller than 1 µm, but can be larger than 200 µm.

A mass of multiple NGPs (including single-layer and/or few-layer graphene sheets, 33 in FIG. 1(a)) may be made into a graphene film/paper (34 in FIG. 1(a) or 114 in FIG. 1(b)) using a film- or paper-making process. FIG. 3(b) shows a SEM image of a cross-section of a graphene paper/film prepared from discrete graphene sheets using a paper-making process. The image shows the presence of many discrete graphene sheets being folded or interrupted (not integrated), most of platelet orientations being not parallel to the film/paper surface, the existence of many defects or imperfections. NGP aggregates, even when being closely packed, exhibit a thermal conductivity higher than 1,000 W/mK only when the film or paper is cast and strongly pressed into a sheet having a thickness lower than 10 µm, and higher than 1,500 W/mK only when the film or paper is cast and pressed into a sheet having a thickness lower than 1 µm. A heat spreader in many electronic devices is normally required to be thicker than 25 µm and, more desirably, thicker than 50 µm based mainly on handling ease and structural integrity considerations (but no greater than 200 µm due to device volume constraint).

The precursor to the unitary graphene layer is graphene oxide (GO) gel. This gel is obtained by immersing a graphitic material 20 in a powder or fibrous form in a strong oxidizing liquid in a reaction vessel to form a suspension or slurry, which initially is optically opaque. This optical opacity reflects the fact that, at the outset of the oxidizing reaction, the discrete graphite flakes and, at a later stage, the discrete graphene oxide flakes scatter visible wavelengths, resulting in an opaque and generally dark fluid mass. If the reaction between graphite powder and the oxidizing agent is allowed to proceed at a sufficiently high reaction temperature for a sufficient length of time, this opaque suspension is transformed into a translucent or transparent solution, which is now a homogeneous fluid called "graphene oxide gel" (21 in FIG. 1(a)) that contains no discernible discrete graphite flakes or graphite oxide platelets.

In other words, this graphene oxide gel is optically transparent or translucent and visually homogeneous with no discernible discrete flakes/platelets of graphite, graphene, or graphene oxide dispersed therein. In contrast, conventional suspension of discrete graphene sheets, graphene oxide sheets, and expanded graphite flakes look dark, black or heavy brown in color with individual graphene or graphene oxide sheets or expanded graphite flakes discernible or recognizable even with naked eyes or a low-magnification light microscope (100×-1,000×).

The graphene oxide molecules dissolved in the liquid medium of a graphene oxide gel are aromatic chains that have an average number of benzene rings in the chain typically less than 1,000, more typically less than 500, and many less than 100. Most of the molecules have more than 5 or 6 benzene rings (mostly >10 benzene rings) from combined atomic force microscopy, high-resolution TEM, and molecular weight measurements. Based on our elemental analysis, these benzene-ring type of aromatic molecules are heavily oxidized, containing a high concentration of functional groups, such as —COOH and —OH and, therefore, are "soluble" (not just dispersible) in polar solvents, such as water. The estimated molecular weight of these graphene oxide polymers in the gel state is typically between 200 g/mole and 43,000 g/mole, more typically between 400 g/mole and 21,500 g/mole, and most typically between 400 g/mole and 4,000 g/mole.

These soluble molecules behave like polymers and are surprisingly capable of reacting and getting chemically connected with one another to form a unitary graphene layer of good structural integrity and high thermal conductivity. Conventional discrete graphene sheets, graphene oxide sheets, or graphite flakes do not have any self-reacting or cohesive bonding capability.

Specifically and most significantly, these graphene oxide molecules present in a GO gel state are capable of chemically merging with one another and getting integrated into extremely long and wide graphene layers (e.g. FIG. 3(a)) when the gel is dried and heat-treated at a sufficiently high temperature for a sufficiently long period of time. These graphene layers can run as wide as the specimen width itself (up to hundreds of centimeters) that are parallel to one another. No individual graphene platelets or sheets are discernible; they have been fully linked and integrated chemically with one another to form a layer-like unitary body. These unitary bodies appear to be chemically bonded with one another along the thickness-direction (or Z-direction). x-ray diffraction studies have confirmed that the d-spacing (inter-graphene plane distance) has been recovered back to approximately 0.335 nm (with <0.02% by weight of oxygen) to 0.40 nm (approximately 5.0-10% oxygen). There does not appear to be any gap between these graphene layers and, hence, these layers have been essentially merged into one big unitary body, which is a graphene single crystal. FIG. 3(a) depicts an example of such a huge unitary body. Although there appears to be some demarcations between unitary layers, these perceived demarcations are due to slightly different widths between layers. Each layer is composed of one of multiple graphene planes parallel to one another. These seemingly individual unitary layers actually have formed into a single integrated entity or a graphene single crystal. The formation process for such a graphene single crystal is further illustrated in FIG. 3(c).

It may be noted that the presently invented graphene single crystal is fundamentally different and patently distinct from the catalytic CVD graphene thin film in terms of chemical composition, micro-structure, morphology, process of production, all chemical and physical properties, and intended applications:

(a) As schematically shown in FIG. 3(d), the prior art graphene poly-crystal obtained by CVD of hydrocarbon on a catalytic surface (e.g. Cu or Ni) is typically composed of many grains with grain size typically smaller than 10 μm (most often <5 μm). These grains also have different orientations with respect to one another.

(b) In contrast, FIG. 3(e) shows a schematic of a graphene single crystal of the present invention having just one single grain or domain. There are no grain boundaries that can impede the movement of electrons or phonons and, hence, this single-grain single crystal has an exceptionally high electrical conductivity and thermal conductivity.

(c) FIG. 3(f) shows a schematic of another graphene single crystal of the present invention, which is a "poly-crystal" with incomplete grain boundaries. The graphene planes in all the grains are oriented parallel to one another.

(d) The presently invented graphene single crystal from GO gel typically has an oxygen content from 0.01% to 5%, but no hydrogen (H). In contrast, the catalytic CVD graphene film has some hydrogen content, but no oxygen.

(e) Typically, the CVD graphene film grown on Cu or Ni surface is single layer or inhomogeneous few-layer graphene with a thickness less than 2 nm (the underlying Cu or Ni foil is not capable of providing catalytic effect when the deposited carbon layer exceeds 2 nm). These ultra-thin layers are thus optically transparent and are intended for touch panel screen applications to replace the ITO glass. In contrast, our graphene monolith is typically thicker than 10 nm (more typically thicker than 1 μm, and most typically thicker than 10 μm) and, hence, typically is optically opaque. The graphene monolith of the present invention has a significantly higher thermal conductivity and can be more easily handled when being implemented into an electronic device (e.g. a mobile phone) as a heat spreader.

The unitary graphene layer can be used alone as a heat spreader in an electronic device. Alternatively, this unitary graphene layer can be a coating layer of a two-layer or multi-layer structure. In other words, a layer of graphene oxide-derived unitary graphene entity may be coated onto one or two primary surfaces of a substrate or core layer of a graphitic material, forming a 2-layer or 3-layer structure. The graphitic core or substrate layer has two primary surfaces on the opposite sides of the layer. If one of the primary surfaces is coated with a layer of GO-derived unitary graphene, we have a 2-layer laminate. If both primary surfaces are coated with GO, we have a 3-layer laminate. One may further deposit a layer of protective material on a unitary graphene coating layer to make a 4-layer laminate, for instance. This protective layer can be an electrically insulating resin layer for certain applications, e.g. for transferring heat from a CPU of a mobile phone or laptop computer to the GO coating layer so that the GO coating can help dissipate the heat generated by the CPU. The electrically insulating layer is essential to preventing internal shorting. Further optionally, another layer of material (e.g. a thermal interface material) can be deposited onto the opposite side of this 4-layer laminate to make a 5-layer structure.

The unitary graphene-coated laminate preferably has a thickness no greater than 1 mm, further preferably less than 200 μm, and most preferably less than 100 μm. More preferably, the thickness is greater than 10 μm, further preferably between 10 and 100 μm, and most preferably between 10 μm and 50 μm. A thickness less than 10 μm would make it difficult to handle the laminate when attempting to incorporate pieces of the laminate in a device for thermal management applications (e.g. as a heat spreader in a microelectronic device).

In a special case of using graphene-based graphitic core layer, the constituent graphene sheets (NGPs) preferably contain multi-layer graphene sheets preferably having a thickness of 3.35 nm to 33.5 nm. Preferably, the resulting graphitic core layer has a thickness no greater than 100 μm, more preferably less than 50 μm. When multi-layer graphene sheets have a thickness of 6.7 nm to 20 nm, one can readily produce a graphitic core layer having an exceptional thermal conductivity.

The graphene-based graphitic core layer desirably contains pristine graphene containing no oxygen. The pristine graphene can be obtained from direct ultrasonication without involving oxidation of a graphitic material. As shown in the upper portion of FIG. 1(a), pristine graphite particles 20 (without exposing to the oxidizing or other chemical treatment) may be directly exposed to high-intensity ultrasonication to produce pristine graphene sheets. Multiple pristine graphene sheets may then be aggregated together to form a graphene paper/film 38 via a paper-making procedure, for instance. The pristine graphene paper/film, as a graphitic core foil, is then coated with one or two layers of GO gel to obtain unitary graphene-coated laminate 42 after the heat treatment.

The GO coating material, when in a gel state, typically has an oxygen content of 20-46% by weight. After being deposited onto a primary surface of a graphitic core layer to form a laminate, the subsequent heat treatment process naturally reduces the oxygen content to typically 0.01-10% by weight, more typically 0.01%-5%.

The graphene oxide is obtained from a graphene oxide gel, which gel is composed of graphene oxide molecules dispersed in an acidic medium having a pH value of no higher than 5 and the graphene oxide molecules have an oxygen content no less than 20% by weight. In particular, the gel is obtained by immersing a graphitic material in a powder or fibrous form in an oxidizing liquid in a reaction vessel at a reaction temperature for a length of time sufficient to obtain a graphene oxide gel composed of graphene oxide molecules dispersed in an acidic liquid medium having a pH value of no higher than 5 and the graphene oxide molecules have an oxygen content no less than 20% by weight. As indicated in FIG. 1(a), the unitary graphene oxide coated laminate is formed by depositing a layer of graphene oxide gel 21 to one or both primary surfaces of a graphitic core layer 35 to form a GO gel-coated graphitic foil 36. By removing the residual liquid from the gel in the GO gel coating layer and subjecting the GO gel-coated laminate to a heat treatment we obtain the desired GO-coated graphitic foil laminate 40.

The starting graphitic material for the purpose of forming graphene oxide gel may be selected from natural graphite, artificial graphite, mesophase carbon, mesophase pitch, mesocarbon microbead, soft carbon, hard carbon, coke, carbon fiber, carbon nanofiber, carbon nanotube, or a combination thereof. The graphitic material is preferably in a powder or short filament form having a dimension lower than 20 µm, more preferably lower than 10 µm, further preferably smaller than 5 µm, and most preferably smaller than 1 µm.

Using artificial graphite with an average particle size of 9.7 µm as an example, a typical procedure involves dispersing graphite particles in an oxidizer mixture of sulfuric acid, nitric acid, and potassium permanganate (at a weight ratio of 3:1:0.05) at a temperature of typically 0-60° C. for typically at least 3 days, preferably 5 days, and more preferably 7 days or longer. The average molecular weight of the resulting graphene oxide molecules in a gel is approximately 20,000-40,000 g/mole if the treatment time is 3 days, <10,000 g/mole if 5 days, and <4,000 g/mole if longer than 7 days. The required gel formation time is dependent upon the particle size of the original graphitic material, a smaller size requiring a shorter time. It is of fundamental significance to note that if the critical gel formation time is not reached, the suspension of graphite powder and oxidizer (graphite particles dispersed in the oxidizer liquid) appears completely opaque, meaning that discrete graphite particles or flakes remain suspended (but not dissolved) in the liquid medium. As soon as this critical time is exceeded, the whole suspension becomes optically translucent or transparent, meaning that the heavily oxidized graphite completely loses its original graphite identity and the resulting graphene oxide molecules are completely dissolved in the oxidizer liquid, forming a homogeneous solution (no longer just a suspension or slurry).

It must be further noted that if the suspension or slurry, with a treatment time being shorter than the required gel formation time, is rinsed and dried, we would simply recover a graphite oxide powder or graphite intercalation compound (GIC) powder, which can be exfoliated and separated to produce nano graphene platelets (NGPs). Without an adequate amount of a strong oxidizing agent and an adequate duration of oxidation time, the graphite or graphite oxide particles would not be converted into the GO gel state.

Hence, the NGPs (for use in a graphitic core layer) may be produced by subjecting a graphitic material to a combined treatment of oxidation, exfoliation, and separation. This graphitic material may also be selected from natural graphite, artificial graphite, mesophase carbon, mesophase pitch, mesocarbon microbead, soft carbon, hard carbon, coke, carbon fiber, carbon nanofiber, carbon nanotube, or a combination thereof. The NGPs can also be produced from a process such as (a) direct ultrasonication, (b) potassium melt intercalation and water/alcohol-induced exfoliation, or (c) supercritical fluid intercalation/exfoliation/separation of non-oxidized graphitic material. These processes produce pristine graphene that contains no oxygen.

The graphene oxide-derived unitary graphene-coated laminate of the present invention typically has a thermal conductivity greater than 800 W/mK, more typically greater than 1,000 W/mK (even when the film thickness is greater than 10 µm) and often greater than 1,700 W/mK. This latter valve is typically obtained when the graphitic core layer is relatively thin compared to the unitary graphene coating layers and when the final heat treatment temperature is higher than 2,500° C. The coated laminate typically has an electrical conductivity greater than 3,000 S/cm (even >10,000 S/cm). This high electrical conductivity (greater than 3000 S/cm and up to 20,000 S/cm) can be achieved concurrently with a thermal conductivity greater than 1,000 W/mK (up to 1,900 W/mK). Quite often, the unitary graphene-coated laminate can exhibit a combination of a high electrical conductivity (greater than 1,500 S/cm), a high thermal conductivity (greater than 600 W/mK), a relatively high physical density (greater than 1.4 g/cm$^3$), and a relatively high tensile strength (greater than 10 MPa, often >40 MPa, and can be >120 MPa). The unitary graphene layer-coated laminates also exhibit an exceptional surface hardness and scratch resistance, eliminating the tendency for a graphitic core foil (particularly flexible graphite foil and recompressed graphene platelet foil) to flake off (to emit free carbon or graphite particles into air).

Quite surprisingly, in many samples, the unitary graphene layer-coated laminate has an electrical conductivity greater than 2,000 S/cm, a thermal conductivity greater than 800 W/mK, a physical density greater than 1.8 g/cm$^3$, and a tensile strength greater than 40 MPa. This combination of superior properties has not been achieved with any graphite or non-graphite material. In some cases, the coated laminate exhibits an electrical conductivity greater than 3,000 S/cm (up to 20,000 S/cm), a thermal conductivity greater than 1,500 W/mK (up to 1,900 W/mK), a physical density greater than 2.0 g/cm$^3$, and a tensile strength greater than 40 MPa (up to 120 MPa). This type of graphene oxide-coated laminate may be used as a heat spreader component in a portable device.

The present invention also provides a process for producing a unitary graphene layer or graphene single crystal. The process comprises: (a) preparing a graphene oxide gel having graphene oxide molecules dispersed in a fluid medium, wherein the graphene oxide gel is optically transparent or translucent; (b) depositing a layer of the graphene oxide gel onto a surface of a supporting substrate to form a deposited graphene oxide gel thereon; (c) partially or completely removing the fluid medium from the deposited graphene oxide gel layer to form a graphene oxide layer; and (d) heat-treating the graphene oxide layer to form the unitary graphene layer or graphene single crystal. The process may advantageously further comprise a step of compressing the graphene oxide layer before, during, and/or after the heat-treating step.

The graphene oxide gel is prepared by immersing a graphitic material in a powder or fibrous form in an oxidizing liquid to form an initially optically opaque suspension in a reaction vessel at a reaction temperature for a length of time sufficient to obtain a graphene oxide gel that is optically transparent or translucent, wherein the graphene oxide gel is composed of graphene oxide molecules dispersed in an acidic medium having a pH value of no higher than 5 and the graphene oxide molecules have an oxygen content no less than 20% by weight. The starting material for the preparation of GO gel is a graphitic material selected from natural graphite, artificial graphite, mesophase carbon, mesophase pitch, mesocarbon microbead, soft carbon, hard carbon, coke, carbon fiber, carbon nanofiber, carbon nanotube, or a combination thereof.

In the process, steps (b) and (c) may advantageously include feeding a sheet of a solid substrate material from a roller to a deposition zone, depositing a layer of graphene oxide gel onto a surface of the sheet of solid substrate material to form a graphene oxide gel layer thereon, drying the graphene oxide gel to form a dried graphene oxide layer deposited on the substrate surface, and collecting graphene oxide layer-deposited substrate sheet on a collector roller. This is essentially a roll-to-roll process that is amenable to continuous mass production of unitary graphene materials. The process may further comprise a step of compressing the graphene oxide layer prior to being collected on the collector roller.

In the process, the graphene oxide gel may be deposited onto a primary surface of a supporting substrate using any coating, casting, spraying, or liquid-dispensing process. Upon removal of the liquid medium from the coating layer, the resulting coated laminate is then subjected to a thermal treatment or re-graphitization treatment (typically 100-1000° C., but can be higher), which allows individual graphene oxide molecules to chemically bond to one another. This thermal treatment surprisingly enables or activates the re-joining, polymerization, or chain-growth of otherwise small graphene oxide molecules, resulting in removal of non-carbon elements (e.g. all H and most O) and formation of huge graphene sheets. It appears that the graphene oxide molecules can be merged and integrated into several unitary graphene layers that run parallel to one another and these graphene layers can cover the entire length of the coating layer without interruption. In other words, these graphene layers are each a complete unitary graphene entity. These complete unitary graphene layers actually constitute one unitary entity that is essentially a graphene block with all graphene planes being oriented along one single direction (e.g. as schematically shown in FIG. 3(a) or FIG. 3(c)).

The unitary graphene layer of the present invention is often a single crystal (as schematically shown in FIG. 3(e)) or a poly-crystal with incomplete grain boundaries (e.g. schematically shown in FIG. 3(f)) which is essentially a graphene single crystal as well. By contrast, the prior art graphene film (single layer or few layer <2 nm thick) prepared by catalytic chemical vapor deposition (CVD) on a catalyst surface (Cu or Ni) is essentially poly-crystalline graphene with grain sizes typically <100 µm and more typically <10 µm. This CVD graphene film is intended for use as a semiconductor material (e.g. to replace Si in a FET transistor) or as a touch panel screen (e.g. to replace ITO glass used in a display device such as mobile phone screen). This CVD graphene is made by catalyst-assisted decomposition of hydrocarbon gas molecules and deposition of resulting carbon atoms on a Cu or Ni foil at a CVD temperature of typically 800-1,000° C. The electrical conductivity (<2,000 S/cm) and thermal conductivity (<500 W/mK) of the CVD graphene films are typically significantly lower than those of the presently invented graphene single crystals even though these CVD films are typically thinner than 2 nm and our graphene single crystals are typically thicker than 10 nm (often thicker than 10 µm).

This unitary body (or "single crystal") of highly oriented graphene planes exhibits an unprecedented combination of exceptional thermal conductivity, electrical conductivity, structural integrity (strength and ease of handling). These properties are unmatched by any graphitic or non-graphitic material.

The thermal treatment process can be assisted with a calendering or roll-pressing operation to help improve the surface finish of the resulting coated laminate. The unitary graphene layer thickness can be less than 10 µm, but preferably between 10 µm and 200 µm, and most preferably between 20 µm and 100 µm.

As indicated above, flexible graphite foils prepared by re-compression of exfoliated graphite flakes or graphite worms exhibit relatively low thermal conductivity and mechanical strength. The graphite worms can be formed into flexible graphite foils by compression, without the use of any binding material, presumably due to the mechanical interlocking between the voluminously expanded graphite flakes. Although a significant proportion of these flakes are oriented in a direction largely parallel to the opposing surfaces of a flexible graphite sheet (as evidenced by the high degree of anisotropy with respect to thermal and electrical conductivity), many other flakes are distorted, kinked, bent over, or oriented in a direction non-parallel to these sheet surfaces (FIG. 2(b)). This observation has been well demonstrated in many scanning electron micrographs (SEM) published in open or patent literature. Furthermore, the presence of a large number of graphite flakes implies a large amount of interface between flakes, resulting in very high contact resistance (both thermal and electrical resistance).

As a consequence, the electrical or thermal conductivity of the resulting flexible graphite foils dramatically deviates from what would be expected of a perfect graphite single crystal or a graphene layer. For instance, the theoretical in-plane electrical conductivity and thermal conductivity of a graphene layer are predicted to be $1-5 \times 10^4$ S/cm and 3,000-5,000 W/(mK), respectively. However, the actual corresponding values for flexible graphite foils are $1-3 \times 10^3$ S/cm and 140-300 W/(mK), respectively; one order of magnitude lower than what could be achieved. By contrast, the corresponding values for the presently invented unitary graphene-coated graphitic foil are approximately $3.5-20 \times 10^3$ S/cm (3,500-20,000 S/cm) and 600-2,000 W/(mK), respectively.

The present invention also provides a highly thermally conductive unitary graphene layer or unitary graphene-coated laminate that can be used for thermal management applications; e.g. for use as a heat spreader in a microelectronic device (such as mobile phone, notebook computer, e-book, and tablet), flexible display, light-emitting diode (LED), power tool, computer CPU, and power electronics. We are filing separate patent applications to claim the various products or applications of the presently invented GO-coated graphitic laminates.

EXAMPLE 1

Preparation of Nano Graphene Platelets (NGPs)

Chopped graphite fibers with an average diameter of 12 μm was used as a starting material, which was immersed in a mixture of concentrated sulfuric acid, nitric acid, and potassium permanganate (as the chemical intercalate and oxidizer) to prepare graphite intercalation compounds (GICs). The fiber segments were first dried in a vacuum oven for 24 h at 80° C. Then, a mixture of concentrated sulfuric acid, fuming nitric acid, and potassium permanganate (at a weight ratio of 4:1:0.05) was slowly added, under appropriate cooling and stirring, to a three-neck flask containing fiber segments. After 16 hours of reaction, the acid-treated graphite fibers were filtered and washed thoroughly with deionized water until the pH level of the solution reached 6. After being dried at 100° C. overnight, the resulting graphite intercalation compound (GIC) was subjected to a thermal shock at 1050° C. for 45 seconds in a tube furnace to form exfoliated graphite (worms). Five grams of the resulting exfoliated graphite (EG) were mixed with 2,000 ml alcohol solution consisting of alcohol and distilled water with a ratio of 65:35 for 12 hours to obtain a suspension. Then the mixture or suspension was subjected to ultrasonic irradiation with a power of 200 W for various times. After two hours of sonication, EG particles were effectively fragmented into thin NGPs. The suspension was then filtered and dried at 80° C. to remove residue solvents. The as-prepared NGPs have an average thickness of approximately 9.7 nm.

EXAMPLE 2

Preparation of Single-Layer Graphene from Mesocarbon Microbeads (MCMBs)

Mesocarbon microbeads (MCMBs) were supplied from China Steel Chemical Co. This material has a density of about 2.24 g/cm$^3$ with a median particle size of about 16 μm. MCMB (10 grams) were intercalated with an acid solution (sulfuric acid, nitric acid, and potassium permanganate at a ratio of 4:1:0.05) for 72 hours. Upon completion of the reaction, the mixture was poured into deionized water and filtered. The intercalated MCMBs were repeatedly washed in a 5% solution of HCl to remove most of the sulphate ions. The sample was then washed repeatedly with deionized water until the pH of the filtrate was neutral. The slurry was dried and stored in a vacuum oven at 60° C. for 24 hours. The dried powder sample was placed in a quartz tube and inserted into a horizontal tube furnace pre-set at a desired temperature, 1,080° C. for 45 seconds to obtain a graphene material. TEM and atomic force microscopic studies indicate that most of the NGPs were single-layer graphene.

EXAMPLE 3

Preparation of Pristine Graphene

In a typical procedure, five grams of graphite flakes, ground to approximately 20 μm or less in sizes, were dispersed in 1,000 mL of deionized water (containing 0.1% by weight of a dispersing agent, Zonyl® FSO from DuPont) to obtain a suspension. An ultrasonic energy level of 85 W (Branson S450 Ultrasonicator) was used for exfoliation, separation, and size reduction of graphene sheets for a period of 15 minutes to 2 hours.

EXAMPLE 4

Preparation of Graphene Oxide (GO) Gel

Graphite oxide gel was prepared by oxidation of graphite flakes with an oxidizer liquid consisting of sulfuric acid, sodium nitrate, and potassium permanganate at a ratio of 4:1:0.05 at 30° C. When natural graphite flakes (particle sizes of 14 μm) were immersed and dispersed in the oxidizer mixture liquid, the suspension or slurry appears optically opaque and dark. The suspension remains opaque during the first 52 hours of reaction. However, the suspension gradually turns optically translucent (a little cloudy) when the reaction time exceeds 52 hours, and the color of the suspension changes from black to dark brown. After 96 hours, the suspension suddenly becomes an optically transparent solution with light brown color. The solution appears very uniform in color and transparency, indicating the absence of any dispersed discrete objects. The whole solution behaves like a gel, very similar to a typical polymer gel.

Surprisingly, by casting this gel on a glass surface and removing the liquid medium from the cast film we obtain a thin film of graphene oxide that is optically transparent. This thin film looks like, feels like, and behaves like a regular polymer film. However, upon re-graphitization at a temperature (typically >100° C., more typically >1,000° C., further typically >1,500° C., and can be >2,500° C.) for typically 1-3 hours, this GO film is transformed in a unitary graphene entity comprising or being a large-size graphene single crystal. This is a free-standing unitary graphene layer, which can be implemented directly as a heat spreader in an electronic device. Alternatively, as one of the many applications, a unitary graphene layer may be deposited onto a surface of a graphitic substrate layer to form a thermally conductive laminate, described below:

By casting a layer of GO gel onto a graphitic material foil (graphite paper, film, mat, etc) and removing the liquid content from the gel, the resulting solid coating layer sticks to the graphitic foil very well. Actually, the bonding between the GO coating and the graphitic foil is very strong and, after a heat treatment, the GO-derived unitary graphene layer cannot be peeled off from the graphitic foil without tearing apart or removing some graphitic foil material. This implies that GO gel, upon re-graphitization, possesses an exceptional cohesive strength. This is a very surprising observation.

Figure 5A:
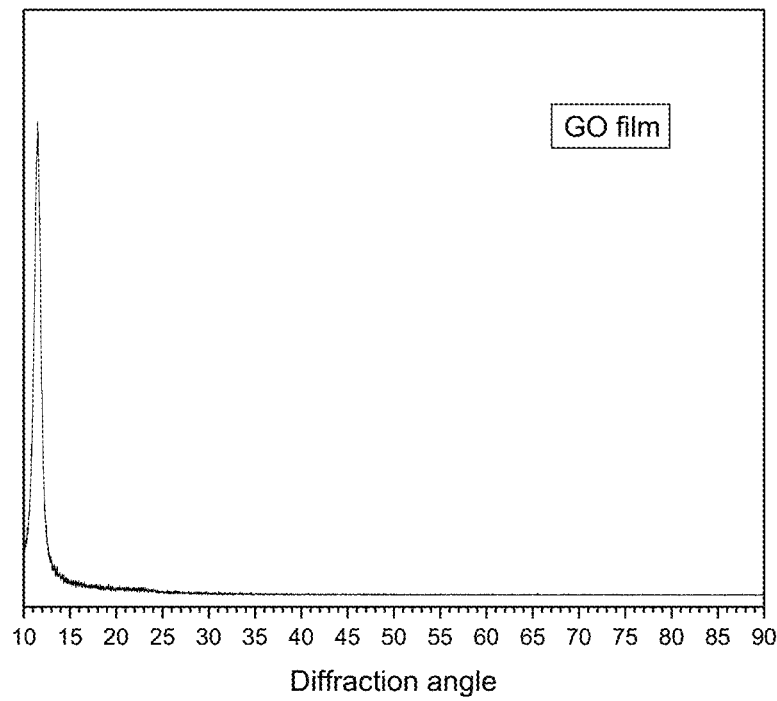
FIG. 5(a) X-ray diffraction curves of a GO film.
Figure 5B:
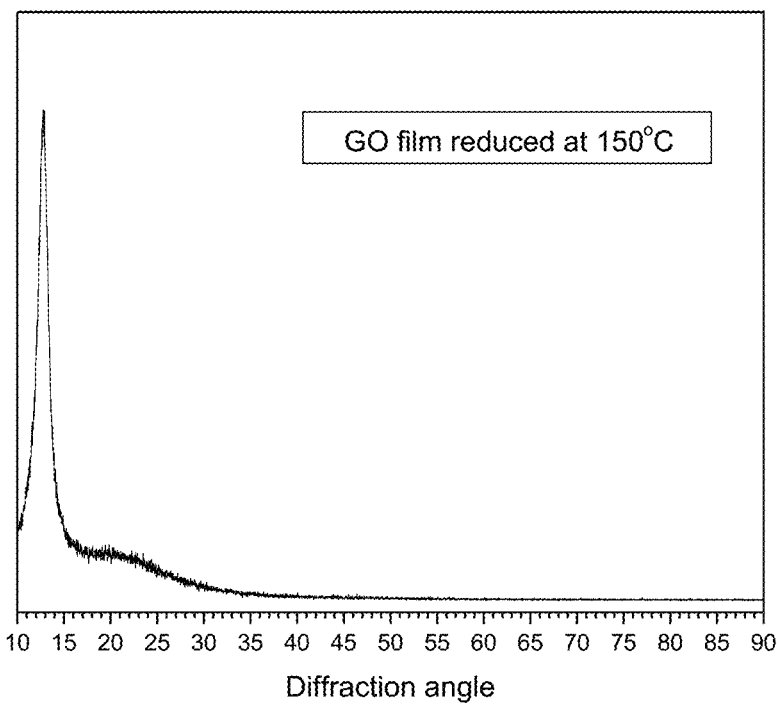
FIG. 5(b) X-ray diffraction curves of a GO film thermally reduced at 150° C. (partially re-graphitized), and FIG. 5(c) X-ray diffraction curves of a highly reduced and re-graphitized GO film (a unitary graphene layer).
Figure 5C:
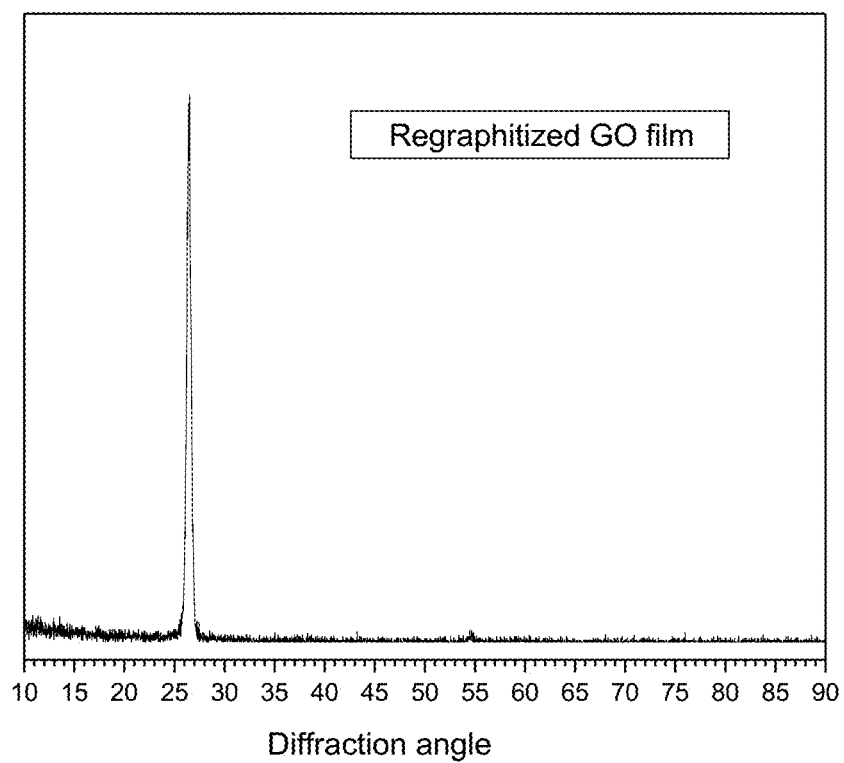

X-ray diffraction curves of a GO film (GO gel coated on a glass surface with liquid medium removed), a GO film thermally reduced at 150° C. for one hour, and a highly reduced and re-graphitized GO film (a unitary graphene layer) are shown in FIG. 5(a), FIG. 5(b), and FIG. 5(c), respectively. The peak at approximately 2θ=12° of the dried GO film (FIG. 5(a)) corresponds to an inter-graphene spacing ($d_{002}$) of approximately 0.7 nm. With some heat treatment at 150° C., the GO film exhibits the formation of a hump centered at 22° (FIG. 5(b)), indicating that it has begun the process of decreasing the inter-graphene spacing, indicating a partial recovery of the original structure of natural graphite particles. With a heat treatment temperature of 2,500° C. for one hour, the $d_{002}$ spacing has decreased to approximately 0.336, close to 0.335 nm of natural graphite.

Figure 6A:
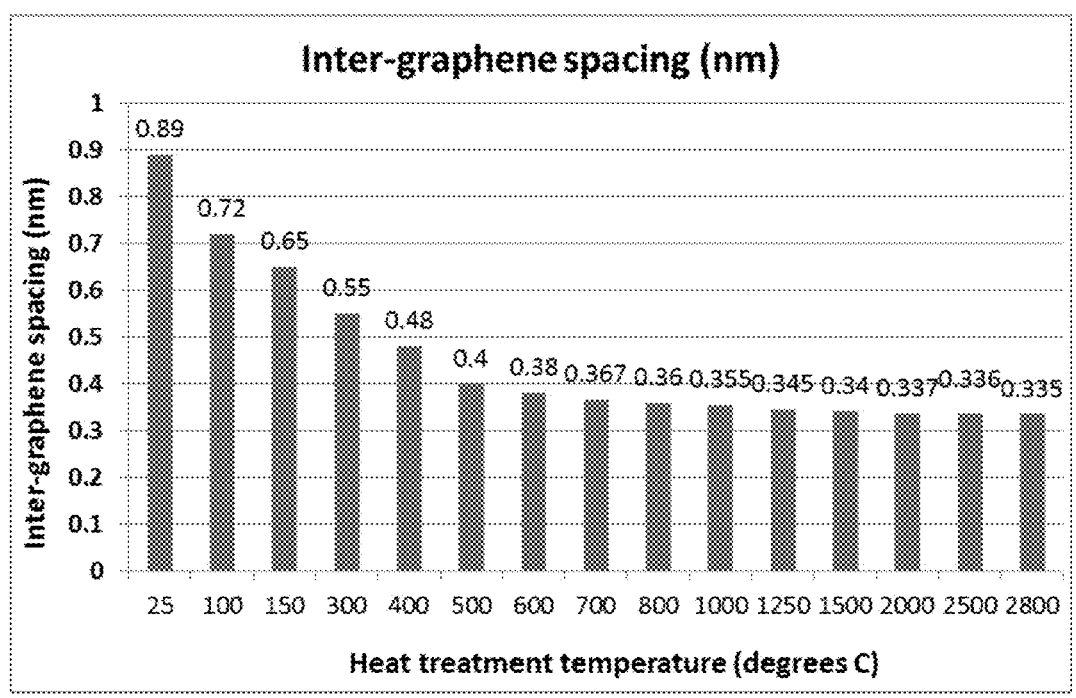
FIG. 6(a) Inter-graphene plane spacing measured by X-ray diffraction.
Figure 6B:
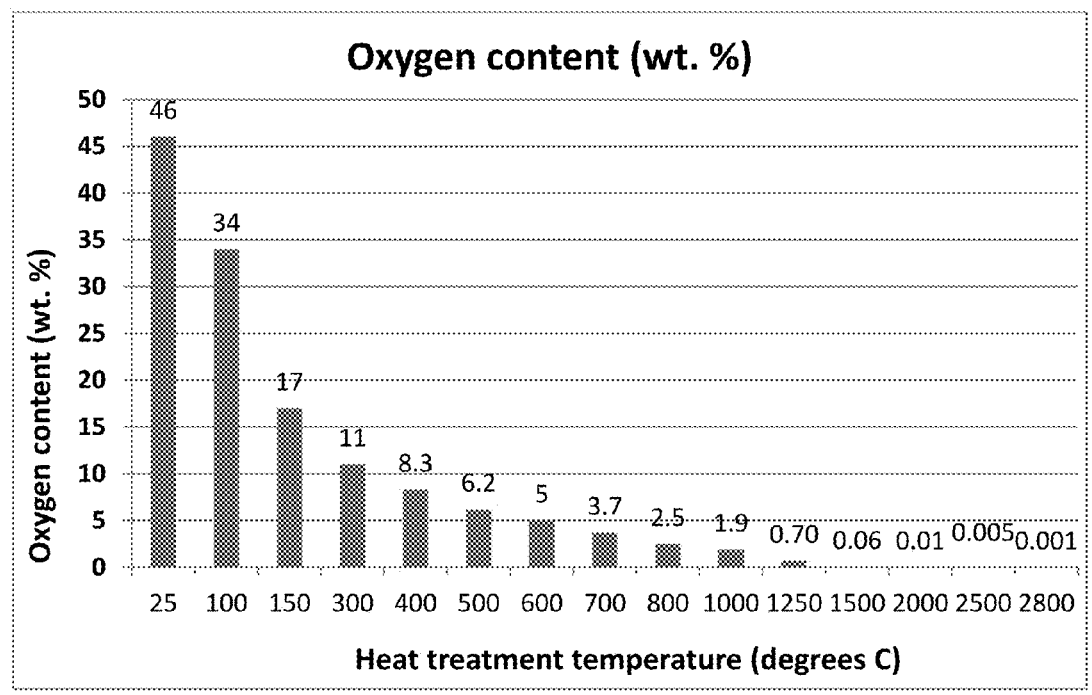
FIG. 6(b) the oxygen content in the GO-derived unitary graphene layer.
Figure 6C:
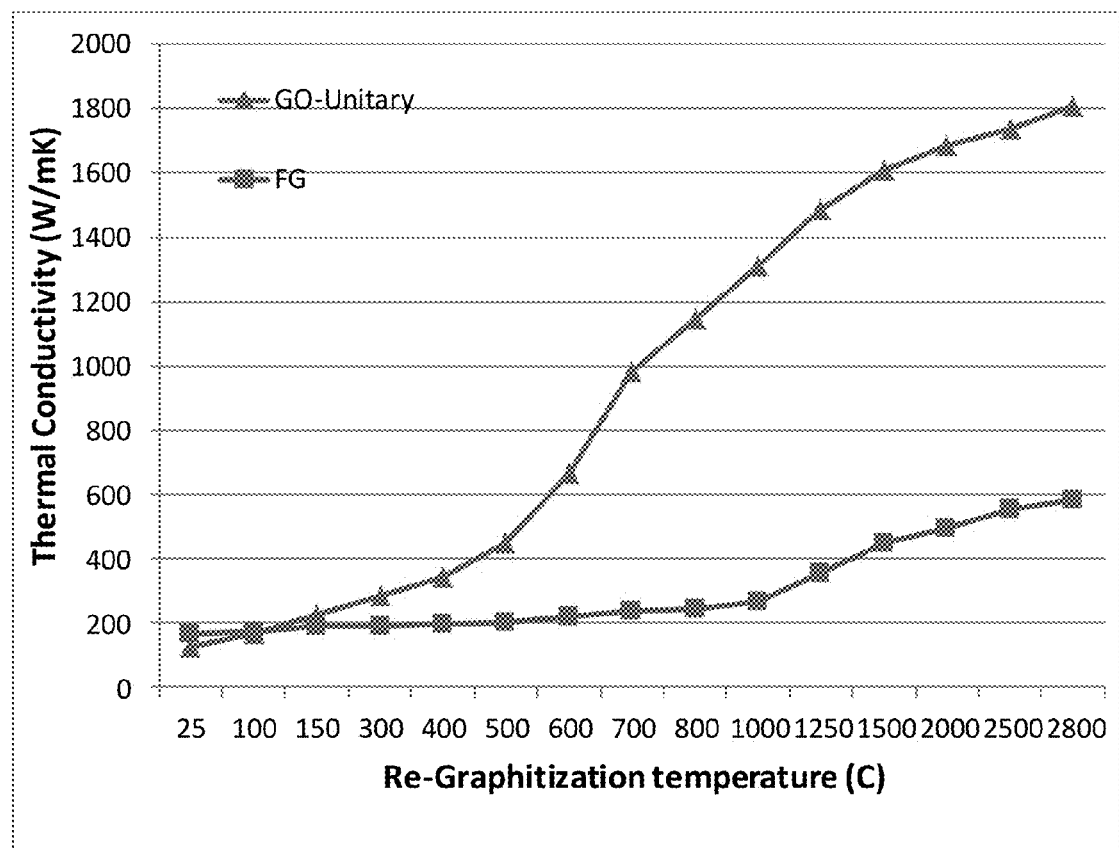
FIG. 6(c) thermal conductivity of GO-derived unitary graphene layer and corresponding flexible graphite (FG) foil, all plotted as a function of the final heat treatment temperature.

The inter-graphene spacing values of GO-derived unitary graphene films obtained by heat treating at various temperatures over a wide temperature range are summarized in FIG. 6(a). Corresponding oxygen content values in the GO-derived unitary graphene layer are shown in FIG. 6(b). The thermal conductivity of GO-derived unitary graphene layer and corresponding flexible graphite (FG) foil, also plotted as a function of the same final heat treatment temperature range is summarized in FIG. 6(c). It is of significance to point out that a heat treatment temperature as low as 500° C. is sufficient to bring the average inter-graphene spacing in GO back to below 0.4 nm, getting closer and closer to that of natural graphite. The beauty of this approach is the notion that this GO gel strategy has enabled us to re-organize and re-orient the graphene planes of carbon atoms into a graphene monolith with all the graphene planes being now essentially parallel to one another. This has given rise to a thermal conductivity already >420 W/mK, which is more than twice of the value (200 W/mK) of the corresponding flexible graphite foil. These graphene planes of carbon atoms are derived from the graphene planes that constitute the original natural graphite structure. The original natural graphite particles, when randomly packed into an aggregate or "graphite compact", have their constituent graphene planes randomly oriented, exhibit relatively low thermal conductivity, and have essentially zero strength (no structural integrity). In contrast, the strength of the unitary graphene layer is typically in the range of 40-140 MPa.

With a heat treatment temperature as low as 800° C., the resulting unitary graphene layer exhibits a thermal conductivity of 1,148 W/mK, in contrast to the 244 W/mK of the flexible graphite foil with an identical heat treatment temperature. As a matter of fact, no matter how high the heat treatment temperature is (e.g. even as high as 2,800° C.), the flexible graphite foil only shows a thermal conductivity lower than 600 W/mK. At a heat treatment temperature of 2,800° C., the presently invented unitary graphene layer delivers a thermal conductivity of 1,807 W/mK.

Figure 2A:
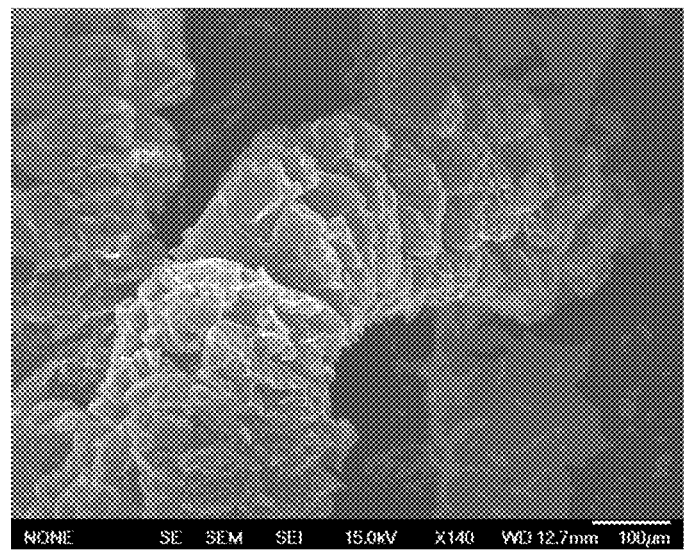
FIG. 2(a) A SEM image of a graphite worm sample after thermal exfoliation of graphite intercalation compounds (GICs) or graphite oxide powders.
Figure 2B:
FIG. 2(b) An SEM image of a cross-section of a flexible graphite foil, showing many graphite flakes with orientations not parallel to the flexible graphite foil surface and also showing many defects, kinked or folded flakes.

A close scrutiny and comparison of FIG. 2(a), FIG. 3(a), and FIG. 3(b) indicates that the graphene layers in a graphene single crystal or graphene monolithic are substantially oriented parallel to one another; but this is not the case for flexible graphite foils and graphene oxide paper. The inclination angles between two identifiable layers in the unitary graphene entity are mostly less than 5 degrees. In contrast, there are so many folded graphite flakes, kinks, and mis-orientations in flexible graphite that many of the angles between two graphite flakes are greater than 10 degrees, some as high as 45 degrees (FIG. 2(b)). Although not nearly as bad, the mis-orientations between graphene platelets in NGP paper (FIG. 3(b)) are also high and there are many gaps between platelets. The unitary graphene entity is essentially gap-free.

FIG. 4 (a) shows the thermal conductivity values of the GO-derived unitary graphene layer (▲), GO paper (■) prepared by vacuum-assisted filtration of RGO, and FG foil (♦), respectively, all plotted as a function of the final heat treatment temperature for graphitization or re-graphitization. These data have clearly demonstrated the superiority of the unitary graphene layer or graphene single crystal in terms of the achievable thermal conductivity at a given heat treatment temperature.

For comparison, we also carbonized polyimide films at 500° C. for 1 hour and at 1,000° C. for 3 hours in an inert atmosphere and then graphitized the films at a temperature in the range of 2,500-3,000° C. for 1 to 5 hours to form a conventional graphitic film, pyrolytic graphite (PG). FIG. 4(b) shows the thermal conductivity values of the GO-derived unitary graphene layer (■) and the polyimide-derived pyrolytic graphite (PG) heat-treated for one hour (x) and for 3 hours (▲), all plotted as a function of the final graphitization or re-graphitization temperature. These data show that the conventional pyrolytic graphite (PG), produced by carbonizing polyimide and then graphitizing the carbonized PI, exhibits a consistently lower thermal conductivity as compared to the GO-derived unitary graphene layer alone (■), given the same heat treatment (graphitization or re-graphitization) temperature for the same length of heat treatment time. For instance, the PG from PI exhibits a thermal conductivity of 820 W/mK after a graphitization treatment at 2,000° C. for one hour and 1,242 W/mK at 2,000° C. for 3 hours. These observations have demonstrated a clear and significant advantage of using the GO gel approach versus the conventional PG approach. As a matter of fact, no matter how long the graphitization time is for the PG, the thermal conductivity is always lower than that of a GO gel-derived unitary graphene layer. In other words, the unitary graphene layer is fundamentally different and patently distinct from both the flexible graphite and the pyrolytic graphite in terms of chemical composition, structure, morphology, process of production, and properties.

Figure 4A:
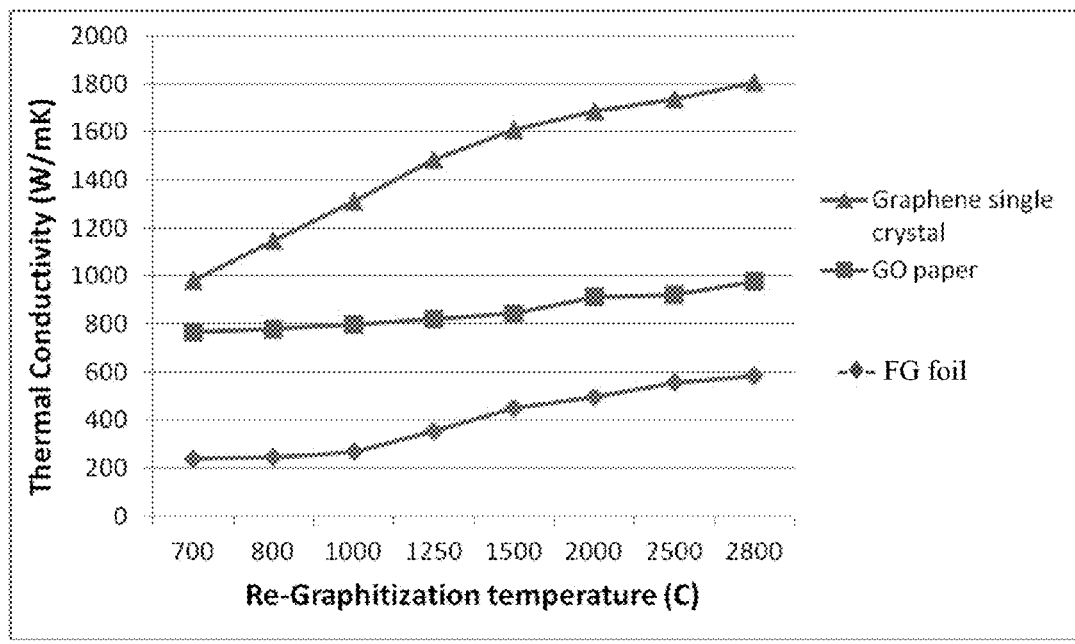
FIG. 4(a) Thermal conductivity values of the GO-derived single unitary graphene layer (▲), GO paper (■), and FG foil (♦) plotted as a function of the final heat treatment temperature for graphitization or re-graphitization.
Figure 4B:
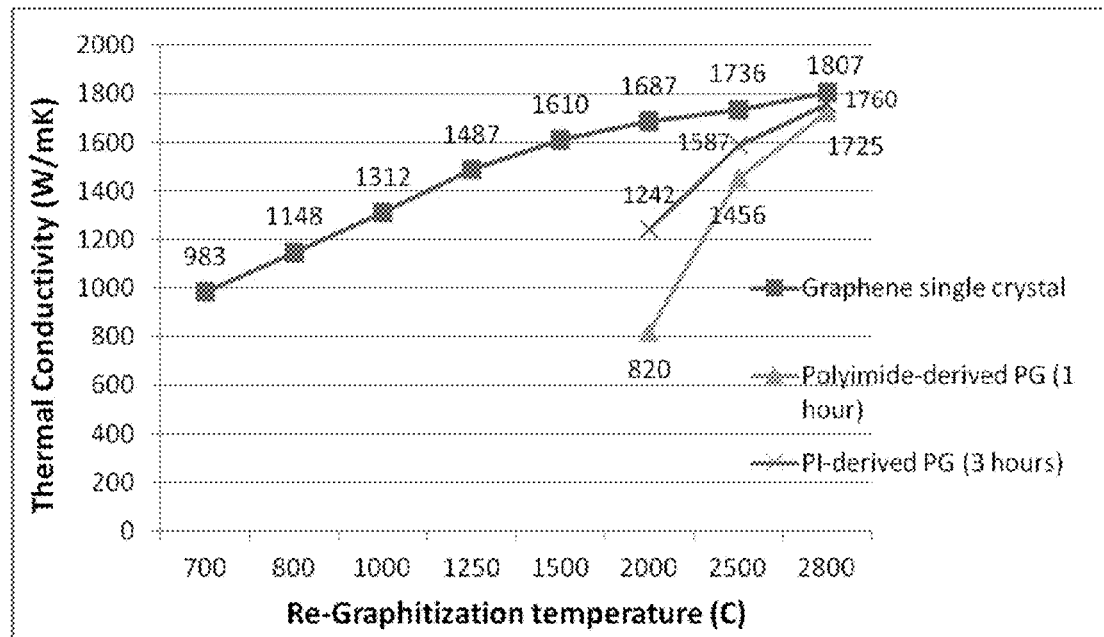
FIG. 4(b) Thermal conductivity values of the GO-derived unitary graphene layer (■) and the polyimide-derived pyrolytic graphite (PG) heat-treated for one hour (x) and for 3 hours (▲), all plotted as a function of the final graphitization or re-graphitization temperature.
Figure 4C:
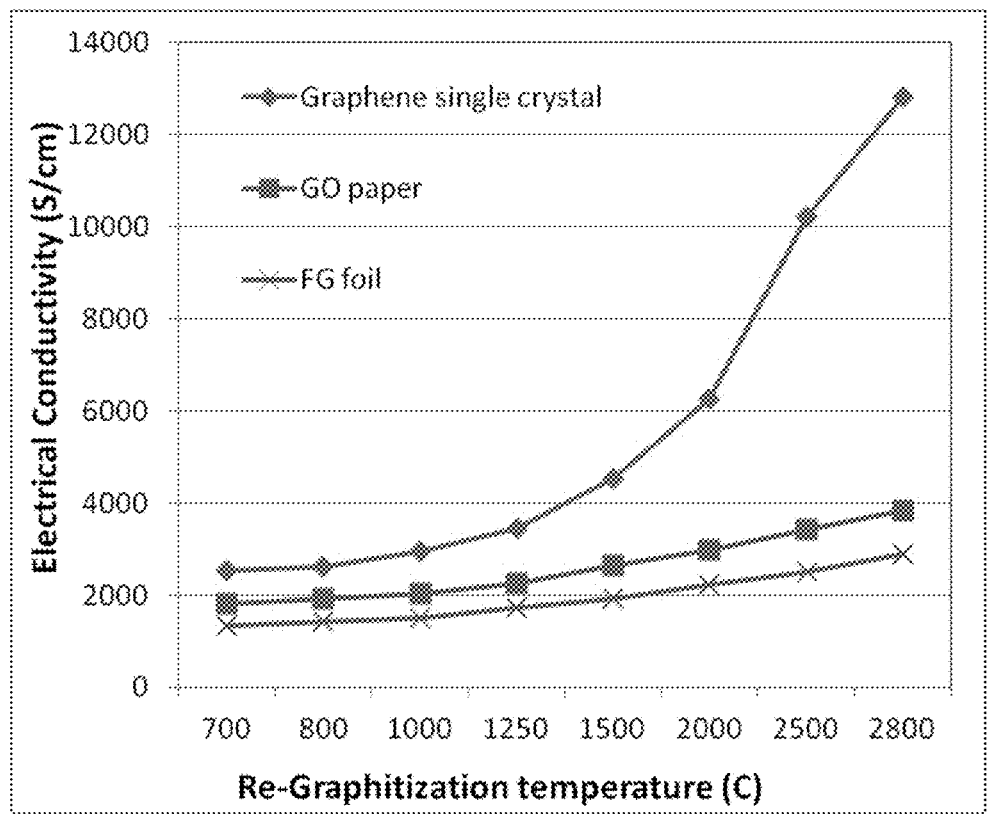
FIG. 4(c) Electric conductivity values of the GO-derived unitary graphene layer (♦), GO paper (■), and FG foil (x) plotted as a function of the final graphitization or re-graphitization temperature. Note: symbol designations varied from (a) to (c).

The above conclusion is further supported by the data in FIG. 4(c) showing the electric conductivity values of the GO-derived unitary graphene layer (♦) are far superior to those of the GO paper (■) from RGO platelets and FG foil (x) over the entire range of final graphitization or re-graphitization temperatures investigated.

EXAMPLES 5

Preparation and Testing of Laminates with a Graphene Oxide-Derived Unitary Graphene Layer Coated on a Core or Substrate Graphitic Foil The NGPs prepared in Examples 1-3 were made into thin paper or film form (e.g., using a vacuum-assisted filtration technique) for use as a graphitic foil. Other graphitic foils investigated include carbon nanotube paper (Bucky paper from Buckeye Composites, Inc., Dayton, Ohio), carbon nanofiber mat (CNFs supplied from Applied Sciences, Inc., Cedarville, Ohio), flexible graphite foils of several different thicknesses (supplied from Graftech and Timcal Graphite), graphite-epoxy composite films prepared in-house, carbon-carbon composite layer prepared in-house (carbon fiber mat reinforced with phenolic resin, which was then carbonized), and carbon paper (Toray). We have also prepared CNT and graphene films that are nanometers in thickness. These nano-thin films were deposited on a plastic film first (PET film, polyethylene terephthalate). PET film serves as an electrically insulating layer to electrically isolate the heat spreader layer from a CPU of a mobile phone or laptop computer.

The graphene oxide gel prepared in Example 4 was used for the preparation of graphene oxide-derived unitary graphene coating. In some cases, discrete NGPs were added into the GO gel to form a mixture gel or NGP-GO gel slurry. In these cases, fully separated NGP platelets were dispersed in graphene oxide gel to produce a graphene platelet gel with the platelet concentration of approximately 1-50% by weight (preferably 5-20% by weight NGP). Ultrasonic waves were employed to assist in the dispersion of NGPs in the gel.

Pure GO gel or NGP-GO mixture gel or slurry was then cast onto a primary surface or both primary surfaces of a graphitic foil using a coating machine equipped with drying and heating provisions. In some cases, the GO gel or NGP-GO gel mixture was casted onto a substrate and regulated by a doctor's blade to form a uniform coating thereon. The liquid in the coating was further removed in a vacuum oven to form a solid GO coating. The resulting coated graphitic foils (also referred to as coated laminates) were then subjected to a heat treatment at a temperature of from 100° C., up to approximately 3,000° C. We have utilized several temperature regimes: 100° C.-1,000° C.; 1,000° C.-1,500° C.; 1,500° C.-2,500° C.; and 2,500° C.-3,000° C.

EXAMPLES 6

Electrical and Thermal Conductivity Measurements of Various Graphene Oxide-Derived Unitary Graphene-Coated Graphitic Foils Four-point probe tests were conducted on unitary graphene layer-coated graphitic foils (e.g. flexible graphite foil, FG), the GO-derived unitary graphene layer alone (coated on a glass surface and then peeled off and heat treated), and the FG foils alone (no coating) to measure their in-plane electrical conductivity. Their in-plane thermal conductivity was measured using a laser flash method (Netzsch Thermal Diffusivity Device).

The in-plane thermal and electrical conductivities and tensile properties of various films or laminates were investigated. Several significant observations can be made from the testing results (e.g. as summarized in FIG. 8(a), (b), and (c):

(1) With a thickness of approximately 75 μm, the thermal conductivity of the flexible graphite foil alone (FG, ▲ in FIG. 4(a)) is less than 237 W/mK if the FG foil is not heat-treated at or above 700° C. As the post-recompression heat treatment temperature increases from 700° C. to 2,800° C. (for one hour of graphitization treatment in each case), the thermal conductivity of the FG foil increases from 237 to 582 W/mK, indicating some but limited re-organization of the graphitic structure induced by the heat treatment. By contrast, the thermal conductivity of the GO-derived unitary graphene layer alone (obtained by depositing a layer of GO gel on a glass surface, removing the liquid from the GO layer in vacuum for 1 hour, and peeling off the dried solid GO layer from the glass surface) increases from 983 to 1,807 W/mK (■ in FIG. 8(a)). This indicates a significant or dramatic re-organization of the graphitic structure induced by the heat treatment, with all GO molecules linked or merged edge-to-edge into unitary graphene layers and integrated into a unitary entity of fully and orderly bonded graphene planes, a graphene single crystal.

Figure 8A:
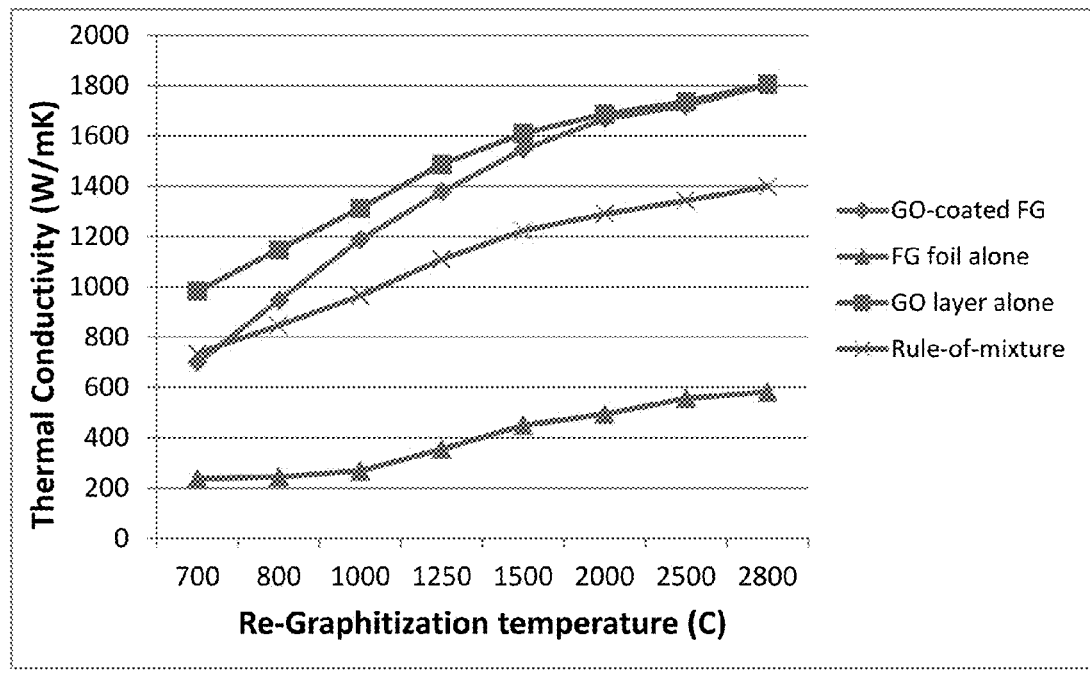
FIG. 8(a) Thermal conductivity values of the GO layer alone (■), GO-coated flexible graphite (FG) foil (♦), and FG foil alone (▲) plotted as a function of the final graphitization or re-graphitization temperature, along with theoretically predicted values (x) based on a rule-of-mixture law (graphitization time=1 hour for all specimens)

(2) The thermal conductivity of a corresponding series of GO-derived unitary graphene-coated FG foils (♦ in FIG. 8(a)) increases from 698 to 1,803 W/mK. This is significantly higher than the thermal conductivity values of what would be theoretically predicted (x in FIG. 8a)) from a rule-of-mixture law, which is commonly used to predict composite properties from constituent properties. Each coating layer is approximately 75 μm thick. These data have clearly demonstrated an unexpected, synergistic effect between GO-derived unitary graphene coating (derived from graphene oxide gel) and the FG foil core layer.

Figure 8B:
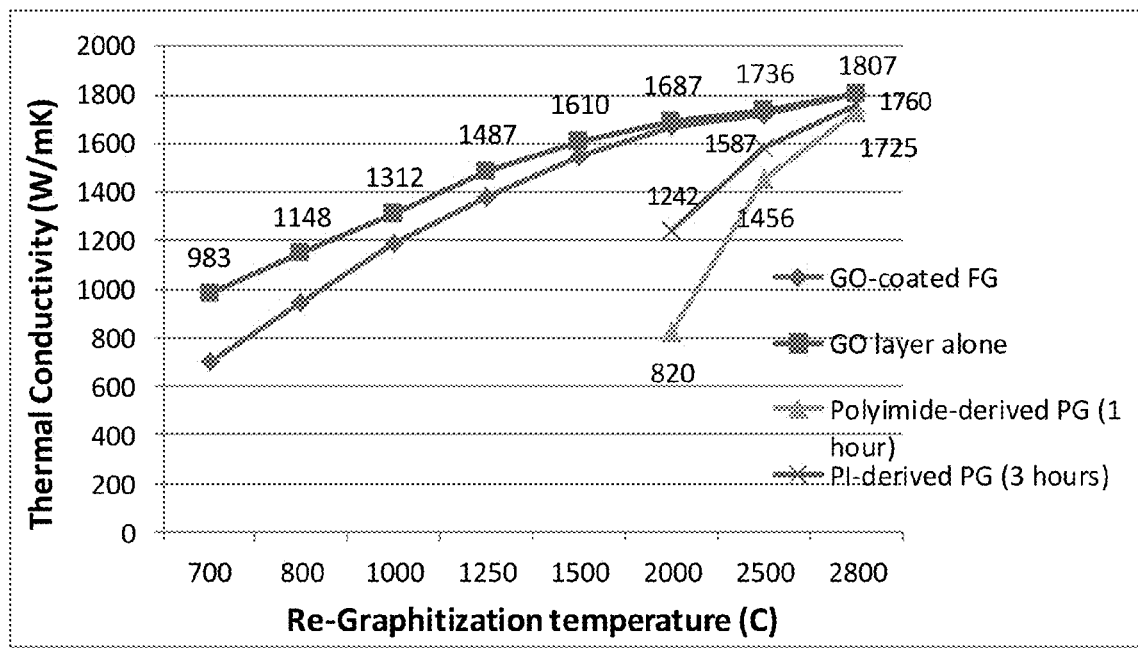
FIG. 8(b) Thermal conductivity values of the GO layer alone (■), GO-coated flexible graphite (FG) foil (♦), and polyimide-derived pyrolytic graphite (PG) plotted as a function of the final graphitization or re-graphitization temperature for one hour, along with those of PG graphitized for 3 hours.

(3) FIG. 8(b) shows that the conventional pyrolytic graphite (PG), produced by carbonizing polyimide and then graphitizing the carbonized PI, exhibits a consistently lower thermal conductivity as compared to the GO-derived unitary graphene layer alone (■) or unitary graphene layer-coated FG laminate (♦), given the same heat treatment (graphitization or re-graphitization) temperature for the same length of heat treatment time. For instance, the PG from PI exhibits a thermal conductivity of 820 W/mK after a graphitization treatment at 2,000° C. for one hour and 1,242 W/mK at 2,000° C. for 3 hours. These observations have demonstrated a clear and significant advantage of using the GO gel approach versus the conventional PG approach. As a matter of fact, no matter how long the graphitization time is for the PG, the thermal conductivity is always lower than that of a GO gel-derived unitary graphene or unitary graphene-coated FG laminate. In other words, both the GO-derived unitary graphene layer and unitary graphene-coated graphitic foils are fundamentally different and patently distinct from the pyrolytic graphite in terms of chemical composition, structure, morphology, process of production, and properties.

Figure 8C:
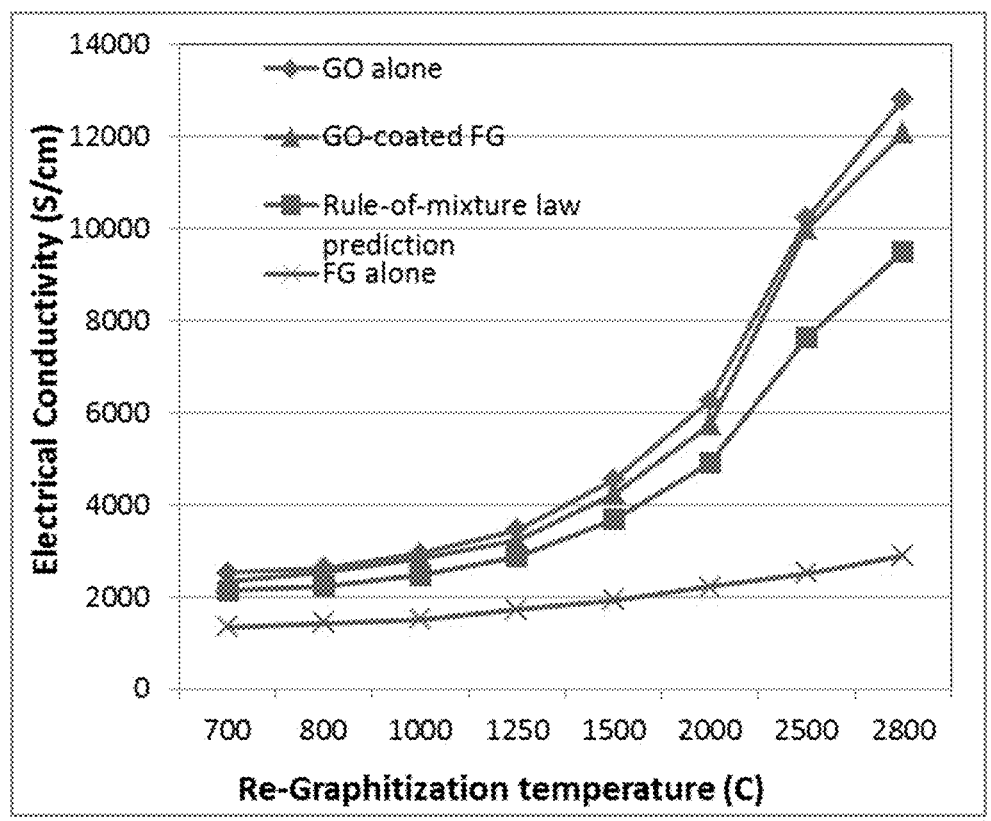
FIG. 8(c) Electric conductivity values of the GO layer alone (♦), GO-coated flexible graphite (FG) foil (▲), and FG foil alone (x) plotted as a function of the final graphitization or re-graphitization temperature, along with theoretically predicted values (■) based on a rule-of-mixture law. Note: symbol designations varied from (a) to (c).

(4) FIG. 8(c) also shows a dramatic synergistic effect in electrical conductivity when GO gel is coated to the surfaces of a FG foil to form a GO-coated laminate and then heat-treated to form the unitary graphene-coated laminate. All the electric conductivity values of unitary graphene-coated laminates are significantly higher than those predicted by the rule-of-mixture law.

EXAMPLES 7

Tensile Strength of Various Graphene Oxide-Derived Unitary Graphene-Coated Graphitic Foils A series of GO-derived unitary graphene-coated FG foils were prepared with the coating thickness varying from approximately 10 μm to 80 μm per coating layer. The core FG foil is approximately 100 μm thick. A universal testing machine was used to determine the tensile strength of various coated laminates and their uncoated counterparts (core layer only).

Figure 9A:
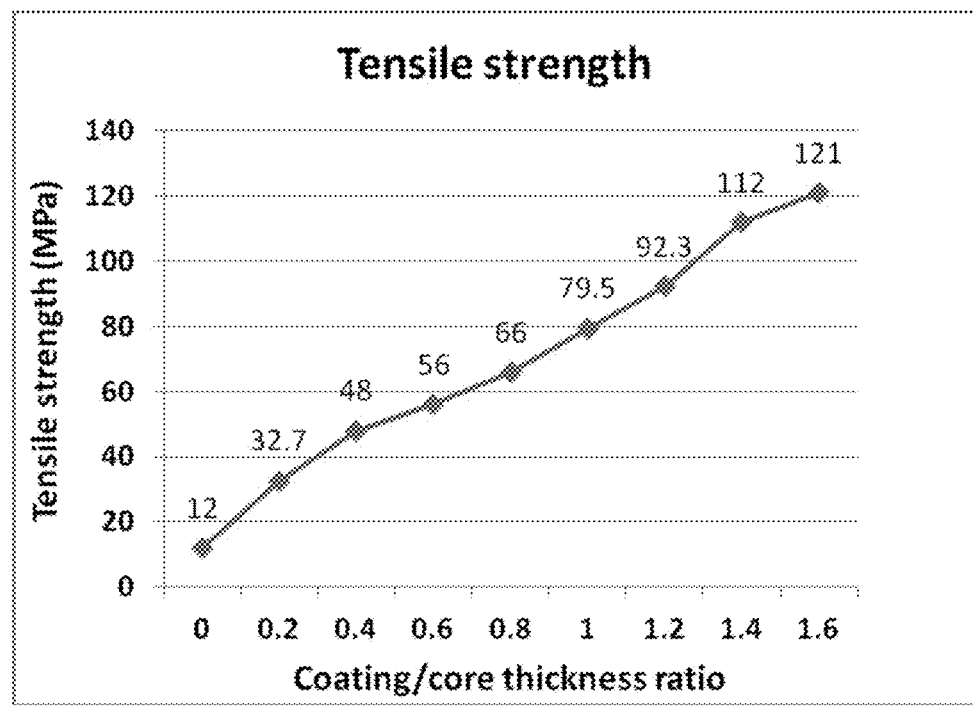
FIG. 9(a) Tensile strength of a series of GO-derived unitary graphene-coated FG foils plotted as a function of the coating-to-core layer thickness ratio.

The tensile strength values are plotted as a function of the coating-to-core thickness ratio, FIG. 9(a). The data have demonstrated that the tensile strength of the flexible graphite foil increases monotonically with respect to the GO-derived unitary graphene coating thickness. (The effect of the specimen thickness increases, due to the deposition of GO-derived unitary graphene layers, has been taken into account by dividing the specimen breaking force by the actual specimen cross-sectional area.) A ten-fold increase in tensile strength, from 12 MPa to 121 MPa, was observed with two coating layers (each 80 μm thick) being uniformly deposited onto the two primary surfaces of the FG foil. This result is quite striking and further reflects the notion that the GO gel-derived GO layer (a unitary graphene entity or graphene single crystal) is a class of material by itself.

SEM investigation of specimen fracture surfaces has shown that the failure of these foils and laminates was always initiated from the FG foil itself (not from a GO-derived unitary graphene coating layer, if present), and often from a site near a FG surface or edge. The FG surface or edge appears to have abundant surface defects that could serve as a mechanical stress concentration site, promoting crack initiation. The presence of a unitary graphene coating layer appears to be capable of significantly smoothing out the surface defects and delaying the crack initiation step.

When the stress is sufficiently high, cracks are eventually initiated near the FG surface/edge, leading to final tensile failure.

Another unexpected observation is the notion that the tensile strength of the unitary graphene-coated laminate increases monotonically with the increasing unitary graphene coating amount, reaching a value of 121 MPa that is one order of magnitude higher than the typical strength of flexible graphite-type materials. This appears to suggest that GO gel has a strong adhering power capable of bonding GO to a graphitic foil and also that GO molecules in a GO gel are capable of combining/integrating with one another to form larger and stronger unitary graphene layers or single crystals that are relatively defect-free, leading to a relatively high cohesive strength.

EXAMPLES 8

The Surface Scratch Resistance (in Terms of Scratch Visibility and Scratch Depth), and Hardness of Various Graphene Oxide-Coated Graphitic Foils The scratch test was conducted using the so-called Ford Lab Test Method (FLTM) BN108-13. This apparatus consists of a movable platform connected to five beams with 250 mm in length. A scratch pin is attached to one end of each beam. A highly polished hardened steel ball (1.0±0.1 mm diameter) is placed on the tip of each pin. Each pin is loaded with a weight that exerts a force of 7N, 6N, 3N, 2N, and 0.6N, respectively. Driven by compressed air, the beams draw the pins across the specimen surface and generate scratches. The scratch is made at a sliding velocity of approximately 100 mm/s. All tests were performed at room temperature. Although the test method requires that grained surfaces be evaluated, only the smooth surfaces of the specimens were tested in this study.

After the specimen plaques were scratched, they were evaluated with a reflected light polarizing microscope incorporating a Xenon light source. An image analyzer with Image Analysis Software was used to measure the "gray scale mass," which is the total gray scale value of the object. The camera objective lens is positioned at an angle of 90° from the scratch. The objective lens then registers a portion of the scratch about 1 mm long. The electron signal for each scratch line is then integrated and recorded. The optical mass of an object, M, is the sum of the gray level values, GL, of all pixels in the object. The individual gray level values are assigned by the image analysis program in unit steps in the range of 0-255, where 0=black and 255=white. The optical mass, M, can be computed from: $M = \Sigma GL_i$ (sum over i to n), where n is the number of pixels. The brightness of the object, B, is $B = M/A$, where A represents the area of the object. The percentage change in the brightness between the scratch and the background is the scratch visibility, $\Delta B$, given by $\Delta B = [(B_{scratch} - B_{background})/(B_{background})] \times 100\%$. The depth of the scratch was measured using an interferometer. The magnification was set at 5×. Depth measurements were made from the depth histogram of the scanned area. The scratches were also examined using a scanning electron microscope (SEM).

Indentation hardness tests were also performed on selected specimens. For the Rockwell Hardness test, the ASTM D 785 test procedure was followed. The indenter was a round steel ball with 12.5 mm in diameter (Rockwell R scale). The Rockwell hardness number is a measure of the non-recoverable indentation after a heavy load of 588N for a period of 15 s, and subsequently reduced to a minor load of 98N for another duration of 15 s. Normal hardness is then defined as the load divided by the projected area.

Figure 9B:
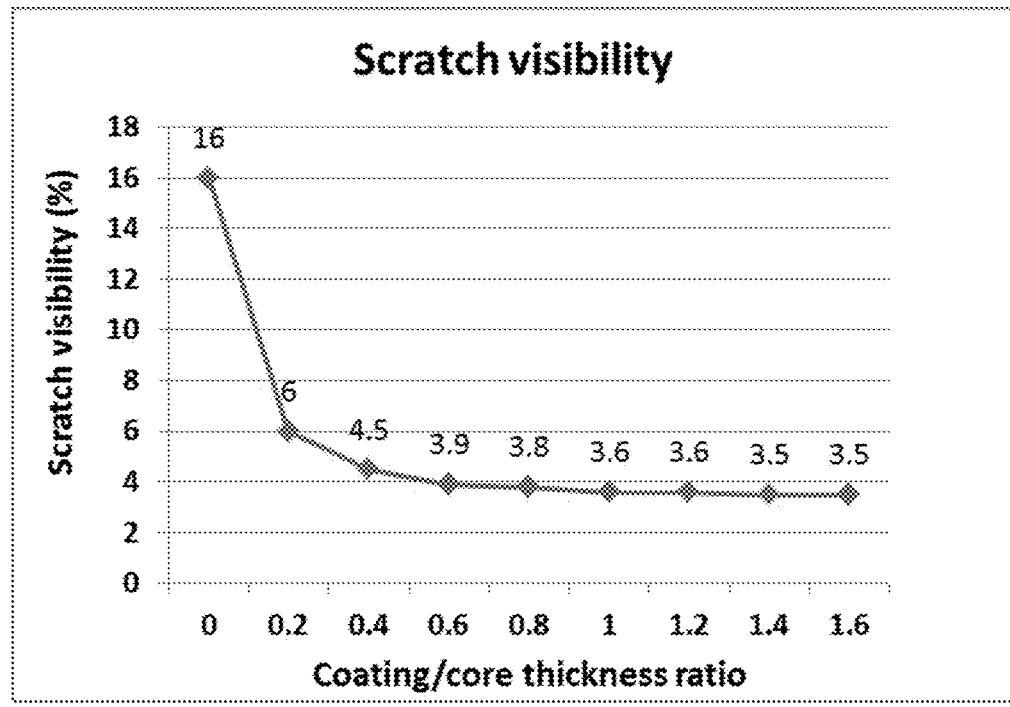
FIG. 9(b) scratch visibility of a series of GO-derived unitary graphene-coated FG foils plotted as a function of the coating-to-core layer thickness ratio.
Figure 9C:
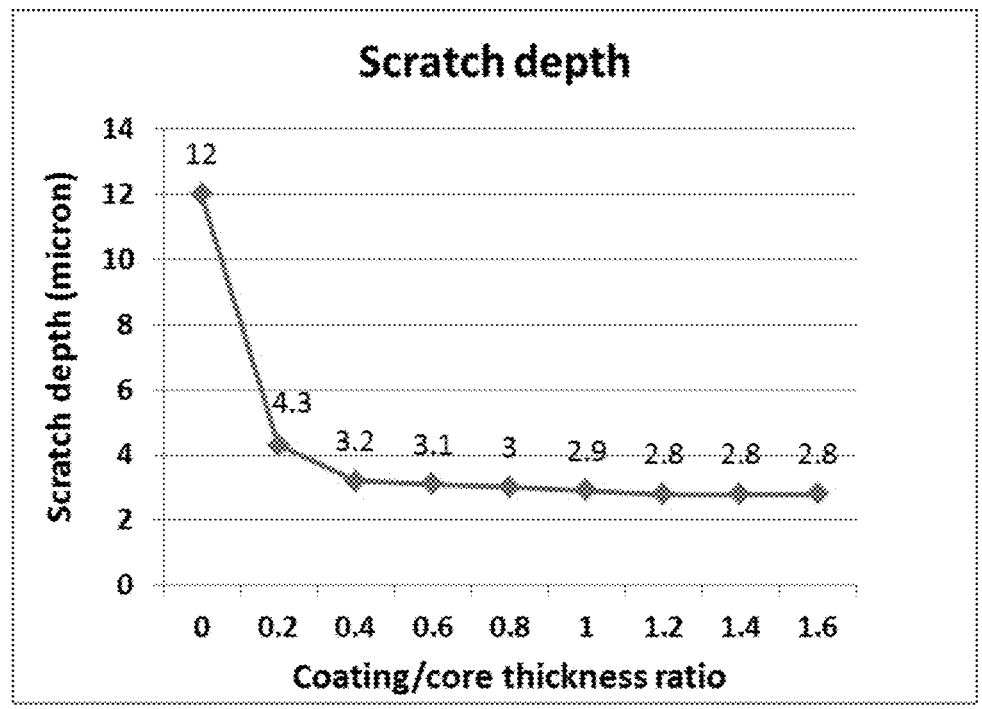
FIG. 9(c) scratch depth of a series of GO-derived unitary graphene-coated FG foils plotted as a function of the coating-to-core layer thickness ratio.
Figure 9D:
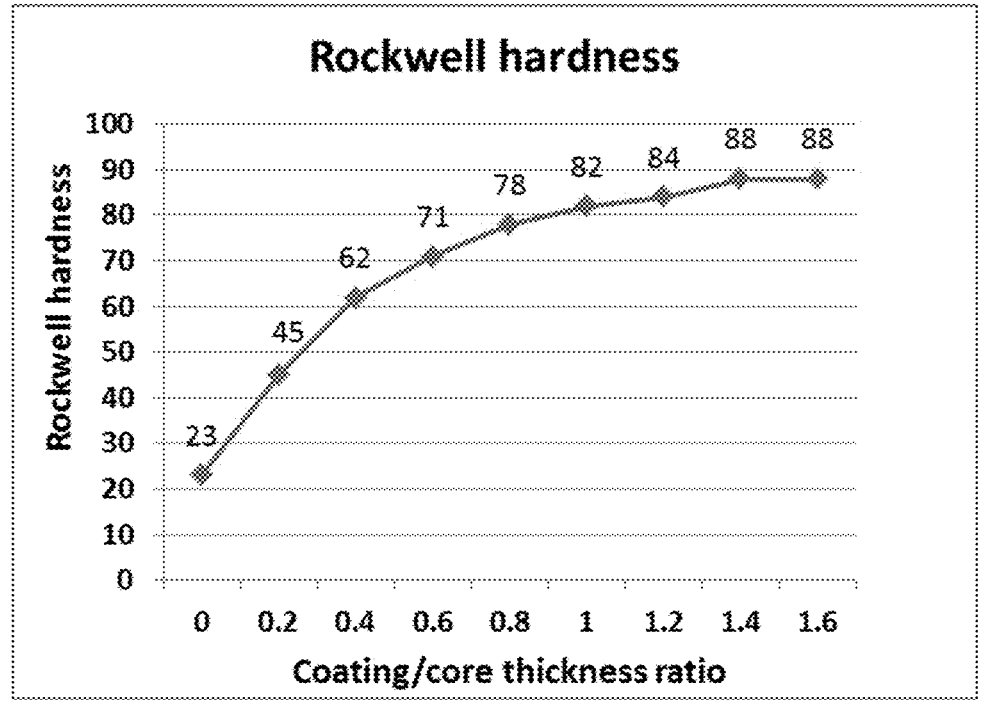
FIG. 9(d) Rockwell hardness of a series of GO-derived unitary graphene-coated FG foils plotted as a function of the coating-to-core layer thickness ratio.

FIG. 9(b), FIG. 9(c), and FIG. 9(d) show the scratch visibility, scratch depth, and Rockwell hardness data, respectively, of a series of GO-derived unitary graphene-coated FG foils plotted as a function of the coating-to-core layer thickness ratio. These data indicate that the bare FG foils are not scratch resistant, exhibiting a high level of scratch visibility and deep scratch marks. The scratch resistance is significantly improved by depositing a thin layer of GO-derived unitary graphene coating; the thicker the unitary graphene coating, the better the scratch resistance. This scratch resistance is a reflection of improved surface hardness due to the unitary graphene coating layer as shown in FIG. 9(d).

EXAMPLES 9

Properties of Various Types of Unitary Graphene-Coated Graphitic Foils

Examples of graphitic foils investigated include: NGP paper, CNT paper, CNF mat, graphite-epoxy composite films, carbon-carbon composite layer, carbon paper, GO gel-bonded NGP composite, PET-supported CNT film, and PET-supported graphene film (PET film was attached after heat treating GO coating). The physical and mechanical properties of a broad array of GO-coated graphitic foils are summarized in Table 1 below. The improvements in various properties over the core or substrate alone are due to the superior properties of the GO gel-derived unitary graphene layer or the synergistic effects between the GO gel-derived unitary graphene layer and the core/substrate layer. These exceptional properties are not observed with the core layer alone (e.g. flexible graphite), the catalytic CVD graphene film, and the pyrolytic graphite (including HOPG).

TABLE 1

Properties of selected graphitic foils and their GO-derived unitary graphene-coated versions.

| Sample No. | Graphitic core layer & thickness | Coating heat-treating temp. and thickness | Elect. Cond. (S/cm) | Thermal cond. (W/mk) | Tensile strength (MPa) | Surface hardness (Rockwell) | Scratch resistance |
|---|---|---|---|---|---|---|---|
| 20-A | NGP paper, 120 μm | None | 1427 | 354 | 27 | 34 | Fair |
| 20-B | NGP paper, 120 μm | 1,500° C.; 40 μm | 4,205 | 765 | 98 | 72 | Excellent |
| 21-A | CNT paper, 126 μm | None | 238 | 67 | 61 | 26 | Fair |
| 21-B | CNT paper, 126 μm | 1,500° C.; 40 μm | 4,122 | 667 | 235 | 88 | Excellent |

TABLE 1-continued

Properties of selected graphitic foils and their GO-derived unitary graphene-coated versions.

| Sample No. | Graphitic core layer & thickness | Coating heat-treating temp. and thickness | Elect. Cond. (S/cm) | Thermal cond. (W/mk) | Tensile strength (MPa) | Surface hardness (Rockwell) | Scratch resistance |
|---|---|---|---|---|---|---|---|
| 22-A | CNF mat, 155 μm | None | 162 | 54 | 52 | 28 | Fair |
| 22-B | CNF mat, 155 μm | 1,500° C.; 40 μm | 3825 | 621 | 167 | 82 | Excellent |
| 23-A | Graphite-epoxy, 268 μm | None | 83 | 11 | — | — | — |
| 23-B | Graphite-epoxy, 268 μm | 300° C.; 65 μm | 1224 | 252 | — | — | — |
| 24-A | C/C composite, 232 μm | None | 320 | 88 | — | — | — |
| 24-B | C/C composite, 232 μm | 1,200° C.; 45 μm | 3672 | 617 | — | — | — |
| 25-A | Carbon paper, 156 μm | None | 167 | 61 | 62 | 25 | Poor |
| 25-B | Carbon paper, 156 μm | 2,200° C.; 75 μm | 5,250 | 970 | 165 | 82 | Excellent |
| 26-A | GO gel-bonded NGP composite 103 μm | None | 3,241 | 602 | — | — | — |
| 26-B | GO gel-bonded NGP composite 103 μm | 1,500° C.; 40 μm | 4,725 | 898 | — | — | — |

These data have further demonstrated that a GO-derived unitary graphene coating can significantly improve electric conductivity, thermal conductivity, tensile strength, scratch resistance, and hardness of a graphitic layer. The excellent scratch resistance and surface hardness also result in the reduction or elimination of any graphite or carbon particles from being scratched off the foil surface.

A comparison between Sample 21-A and 21-B and that between 22-A and 22-B reveal a very interesting and significant result. The paper or mat made from CNTs and CNFs, two presumably high-strength materials, show relatively poor strength and hardness. Presumably one could impregnate these porous paper or mat structures with a resin, but that would dramatically curtail the electrical conductivity and thermal conductivity. Instead, by coating both major surfaces of a mat or paper structure with a thin layer of GO gel and then drying and re-graphitizing the GO layer at 1,000° C. for one hour, we have observed that the tensile strengths of both materials were increased by a factor of 3-4. Furthermore, both the thermal conductivity and the electrical conductivity of both CNT paper and CNF mat were increased by one order of magnitude. These exceptional properties, alone or in combination, could not have been achieved with resin-impregnated CNT paper or CNF mat even if the resin matrix is carbonized at 1,500° C. for an extended period of time. It is well-known in the art that carbon/carbon composites, even after repeated resin impregnations and carbonizations, could not reach an electrical conductivity of 1,000 S/cm (typically <<500 S/cm) and could not reach a thermal conductivity of 1,000 W/mK (typically <<300 W/mK).

EXAMPLES 10

Figure 7:
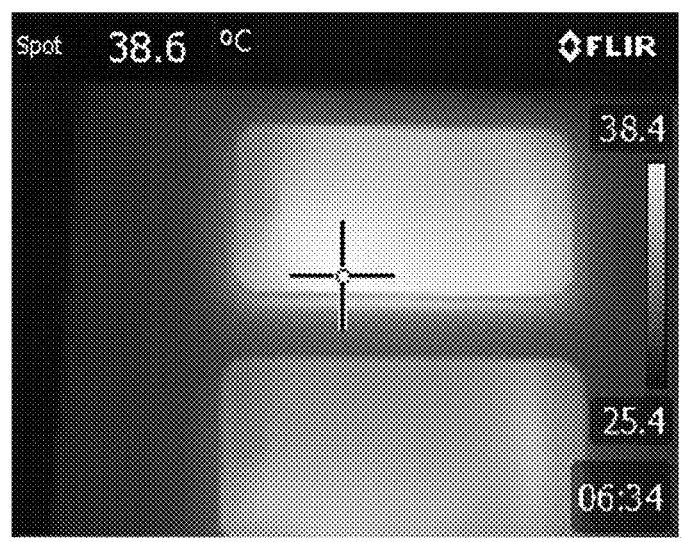
FIG. 7 Surface temperature fields of two identical smart phones running the same video programs for 10 minutes. One smart phone (top image) contains 2 sheets of flexible graphite (FG) foils disposed between the CPU and the casing, showing an external surface temperature as high as 38.6° C. The other smart phone (bottom image) contains one sheet of unitary graphene layer-coated FG foil, showing an external surface temperature of 25.4° C.

Heat Dissipation Systems Containing a Graphene Oxide-Derived Unitary Graphene-Coated Graphitic Foil We have used an infrared thermography-based hand-help device to measure the surface temperatures of a range of microelectronic devices, such as smart phones and laptop computer. For instance, FIG. 7 shows the surface temperature fields of two identical smart phones running the same video programs for 10 minutes. One smart phone (top image) contains 2 sheets of flexible graphite (FG) foils between the CPU and the casing, showing an external surface temperature as high as 38.6° C. The internal temperature near the CPU is presumably much higher than 60 or 70° C., a dangerous temperature that could eventually damage the device. In contrast, the other smart phone (bottom image) contains one sheet of GO-derived unitary graphene-coated FG foil, showing an external surface temperature of 25.4° C. This example has vividly demonstrated the effectiveness of implementing a GO-coated graphitic foil-based heat-spreader layer in a thermal management system.

As indicated in FIG. 8(a) and FIG. 8(b), the presently invented unitary graphene-coated graphitic foils do not have to go through an ultra-high-temperature graphitization treatment. Graphitization of a carbonized resin (e.g. polyimide) or other carbon materials requires a temperature typically higher than 2,000° C., most typically higher than 2,500° C. The graphitization temperature is most typically in the range of 2,800-3,200° C. in order for carbonized materials or pyrolytic graphite to achieve a thermal conductivity of 1,600-1,700 W/mK. In contrast, the typical heat treatment temperature (re-graphitization treatment) of the presently invented GO-coated laminates is significantly lower than 2,500° C. and more typically lower than 1,500° (can be as low as 100-150° C.).

For instance, polyimide (PI), if carbonized and graphitized for 5 hours (including 4 hours for carbonization at 1,000-1,500° C. andl hour for graphitization at 2,000° C.), exhibits a thermal conductivity of 820 W/mK. In contrast, we were able to reach a thermal conductivity of 876 W/mK with a heat treatment of GO at 500° C. for a total of two hours. This is very surprising and no one has ever thought that such a low graphitization temperature was possible. Further, a heat treatment of the GO-derived unitary graphene-coated graphitic foil at the same 2,000° C. for 1 hour imparts a thermal conductivity of 1,680 W/mK. Clearly, this is a dramatically faster, less energy-intensive, and more cost-effective process. The resulting products are also far superior to pyrolytic graphite. The unitary graphene-coated graphitic foil, the unitary graphene layer itself (from GO gel), and the pyrolytic graphite are three fundamentally different and patently distinct classes of materials in terms of chemical composition, morphology, structure, process of production, and various properties.

In conclusion, we have successfully developed an absolutely new, novel, unexpected, and patently distinct class of highly conducting material: graphene oxide gel-derived unitary graphene layer or graphene single crystal. The chemical composition, structure, morphology, process of production, and properties of this new class of materials are fundamentally different and patently distinct from flexible graphite foil, polymer-derived pyrolytic graphite, CVD-derived PG (including HOPG), and catalytic CVD graphene thin film. The thermal conductivity, electrical conductivity, scratch resistance, surface hardness, and tensile strength exhibited by the presently invented materials are much higher than what prior art flexible graphite sheets, graphene paper, or other graphitic films could possibly achieve. These GO-derived unitary graphene materials have the best combination of excellent electrical conductivity, thermal conductivity, mechanical strength, surface scratch resistance, hardness, and no tendency to flake off.

We claim:

1. A heat dissipation system comprising a heat spreader comprising a unitary grapheme monolith comprising closely packed and chemically bonded parallel graphene oxide planes having an inter plane spacing of 0.335 to 0.50 nm, a thickness greater than 10 nm, an electrical conductivity from 1,500 S/cm to 15,000 S/cm, a thermal conductivity from 600 W/mK to 1807 W/mk, and a physical density greater than 1.8 g/cm$^3$, and an oxygen content of 0.01% to 10% by weight, wherein an average mis-orientation angle between two graphene oxide planes is less than 10 degrees.

2. The heat dissipation system of claim 1, wherein the heat spreader has a thickness from 10 nm to 200 µm.

3. The heat dissipation system of claim 1, wherein the heat spreader has a density from 1.8 g/cm$^3$ to 2.1 g/cm$^3$.

4. The heat dissipation system of claim 1, wherein the heat spreader has a tensile strength from 40 MPa to 121 MPa.

5. The heat dissipation system of claim 1, wherein the heat spreader has a Rockwell hardness from 34 to 88.

6. The heat dissipation system of claim 1, wherein the heat spreader contains a poly-crystal having an incomplete grain boundary, and contains no discrete graphite flake or grapheme platelet dispersed therein.

7. The heat dissipation system of claim 1, wherein the heat spreader contains no complete grain boundary therein.

8. The heat dissipation system of claim 1, wherein the chemically bonded parallel grapheme planes contain a combination of sp2 and sp3 electronic configurations.

9. The heat dissipation system of claim 1, wherein the heat spreader contains grains from 100 µm to 1 cm in size.

10. The heat dissipation system of claim 1, wherein the heat spreader further comprises a protective layer.

11. The heat dissipation system of claim 10, wherein the protective layer is selected from electrically insulating including PET film and resin.

12. The heat dissipation system of claim 1, wherein the unitary graphene monolith further comprises nano graphene platelets (NGP) at 1% to 50% by weight.

13. The heat dissipation system of claim 1, wherein the heat spreader further comprises a graphitic substrate.

14. The heat dissipation system of claim 13, wherein the graphitic substrate comprises a material selected from pristine graphene paper, carbon nanotube paper, carbon nanofiber mat, flexible graphite foil, graphite-epoxy composite film, carbon-carbon composite layer, carbon paper, and combinations thereof.

15. The heat dissipation system of claim 1, comprising a unitary graphene monolith coated onto one or two primary surfaces of a graphitic substrate, wherein the coating has a thickness of 10 µm to 80 µm.

16. The heat dissipation system of claim 1, wherein the heat spreader further comprises a graphitic core.

17. The heat dissipation system of claim 16, wherein the graphitic core comprises a material selected from pristine graphene paper, carbon nanotube paper, carbon nanofiber mat, flexible graphite foil, graphite-epoxy composite film, carbon-carbon composite layer, carbon paper, and combinations thereof.

18. The heat dissipation system of claim 17, wherein the graphitic core has a thickness from 100 µm to 268 µm.

19. The heat dissipation system of claim 1, comprising a unitary graphene monolith coated onto two primary surfaces of a graphitic core layer, wherein the coating has a thickness of 10 µm to 80 µm per layer.

20. The heat dissipation system of claim 1, configured for use in a power tool; a microelectronic or telecommunication device including mobile phone, tablet, laptop computer and LCD display; or a light-emitting diode (LED) lighting device or system.

* * * * *